US011444237B2

(12) United States Patent
Sato et al.

(10) Patent No.: US 11,444,237 B2
(45) Date of Patent: Sep. 13, 2022

(54) SPIN ORBIT TORQUE (SOT) MEMORY DEVICES AND METHODS OF FABRICATION

(71) Applicant: Intel Corporation, Santa Clara, CA (US)

(72) Inventors: Noriyuki Sato, Hillsboro, OR (US); Tanay Gosavi, Hillsboro, OR (US); Gary Allen, Portland, OR (US); Sasikanth Manipatruni, Portland, OR (US); Kaan Oguz, Portland, OR (US); Kevin O'Brien, Portland, OR (US); Christopher Wiegand, Portland, OR (US); Angeline Smith, Hillsboro, OR (US); Tofizur Rahman, Portland, OR (US); Ian Young, Portland, OR (US); Ben Buford, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 896 days.

(21) Appl. No.: 16/024,393

(22) Filed: Jun. 29, 2018

(65) Prior Publication Data

US 2020/0006630 A1    Jan. 2, 2020

(51) Int. Cl.
| | |
|---|---|
| *H01L 43/02* | (2006.01) |
| *H01L 43/12* | (2006.01) |
| *H01L 27/22* | (2006.01) |
| *G11C 11/16* | (2006.01) |
| *H01F 10/32* | (2006.01) |
| *H01L 43/10* | (2006.01) |
| *G11C 11/14* | (2006.01) |

(52) U.S. Cl.
CPC ............ *H01L 43/02* (2013.01); *G11C 11/161* (2013.01); *H01F 10/329* (2013.01); *H01F 10/3254* (2013.01); *H01L 27/222* (2013.01); *H01L 43/12* (2013.01); *G11C 11/14* (2013.01); *H01F 10/3286* (2013.01); *H01L 43/10* (2013.01)

(58) Field of Classification Search
CPC .............................. H01L 43/02; G11C 11/161
See application file for complete search history.

(56) References Cited

U.S. PATENT DOCUMENTS

| | | | |
|---|---|---|---|
| 6,057,049 A | 5/2000 | Fuke et al. |
| 6,965,138 B2 | 11/2005 | Nakajima et al. |
| 7,098,495 B2 | 8/2006 | Sun et al. |
| 7,538,402 B2 | 5/2009 | Fukumoto |
| 8,159,870 B2 | 4/2012 | Xia |

(Continued)

FOREIGN PATENT DOCUMENTS

WO    2017052606    3/2017

*Primary Examiner* — Stephen M Bradley
(74) *Attorney, Agent, or Firm* — Essential Patents Group, LLP

(57) ABSTRACT

A spin orbit torque (SOT) memory device includes a SOT electrode having a spin orbit coupling material. The SOT electrode has a first sidewall and a second sidewall opposite to the first sidewall. The SOT memory device further includes a magnetic tunnel junction device on a portion of the SOT electrode. A first MTJ sidewall intersects the first SOT sidewall and a portion of the first MTJ sidewall and the SOT sidewall has a continuous first slope. The MTJ device has a second sidewall that does not extend beyond the second SOT sidewall and at least a portion of the second MTJ sidewall has a second slope.

9 Claims, 18 Drawing Sheets

(56) References Cited

U.S. PATENT DOCUMENTS

| | | |
|---|---|---|
| 8,169,821 B1 | 5/2012 | Ranjan et al. |
| 8,476,722 B2 | 7/2013 | Lee |
| 9,251,883 B2 | 2/2016 | Wu et al. |
| 10,276,784 B1 | 4/2019 | Yu et al. |
| 10,283,701 B1 | 5/2019 | Ikhtiar et al. |
| 10,522,740 B2 * | 12/2019 | Chuang ................. H01L 27/228 |
| 2004/0150017 A1 | 8/2004 | Tsang |
| 2004/0211963 A1 | 10/2004 | Garni et al. |
| 2005/0174836 A1 | 8/2005 | Sharma et al. |
| 2005/0247964 A1 | 11/2005 | Pietambaram et al. |
| 2007/0063237 A1 | 3/2007 | Huai et al. |
| 2007/0183187 A1 | 8/2007 | Guo |
| 2008/0273375 A1 | 11/2008 | Dahmani et al. |
| 2009/0166773 A1 | 7/2009 | Ohno et al. |
| 2012/0126905 A1 | 5/2012 | Zhang et al. |
| 2012/0163070 A1 | 6/2012 | Nagase et al. |
| 2013/0001506 A1 | 1/2013 | Sato et al. |
| 2013/0001652 A1 | 1/2013 | Yoshikawa et al. |
| 2013/0099780 A1 | 4/2013 | Ma et al. |
| 2014/0021426 A1 | 1/2014 | Lee et al. |
| 2014/0056060 A1 | 2/2014 | Khvalkovskiy et al. |
| 2014/0084398 A1 | 3/2014 | Oguz et al. |
| 2014/0084938 A1 | 3/2014 | Lai et al. |
| 2014/0145792 A1 | 5/2014 | Wang et al. |
| 2014/0269035 A1 | 9/2014 | Manipatruni et al. |
| 2014/0306302 A1 | 10/2014 | Guenole et al. |
| 2015/0035095 A1 | 2/2015 | Kim et al. |
| 2015/0061020 A1 | 3/2015 | Yokoyama et al. |
| 2015/0171316 A1 | 6/2015 | Park et al. |
| 2016/0079518 A1 | 3/2016 | Pi et al. |
| 2016/0163965 A1 | 6/2016 | Han et al. |
| 2016/0225423 A1 | 8/2016 | Naik et al. |
| 2017/0148978 A1 | 5/2017 | Apalkov et al. |
| 2018/0083067 A1 * | 3/2018 | Kim ........................ H01L 43/10 |
| 2018/0114898 A1 | 4/2018 | Lee |
| 2018/0123028 A1 | 5/2018 | Shiokawa et al. |
| 2018/0158588 A1 | 6/2018 | Manipatruni et al. |
| 2018/0219152 A1 | 8/2018 | Apalkov et al. |
| 2018/0248114 A1 | 8/2018 | Oguz et al. |
| 2018/0248115 A1 | 8/2018 | Oguz et al. |
| 2018/0374526 A1 | 12/2018 | Lee et al. |
| 2019/0057731 A1 * | 2/2019 | Lua ........................ H01L 43/02 |
| 2019/0081234 A1 | 3/2019 | Naik et al. |
| 2019/0244651 A1 | 8/2019 | Shiokawa et al. |
| 2019/0287589 A1 | 9/2019 | Buyandalai et al. |
| 2019/0304524 A1 | 10/2019 | Oguz et al. |
| 2019/0304653 A1 | 10/2019 | Oguz et al. |
| 2019/0305216 A1 | 10/2019 | Gosavi et al. |
| 2019/0386209 A1 | 12/2019 | Smith et al. |
| 2019/0386662 A1 | 12/2019 | Lin et al. |
| 2020/0006424 A1 | 1/2020 | Sato et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0303981 A1 | 9/2021 | Sasaki et al. |

* cited by examiner

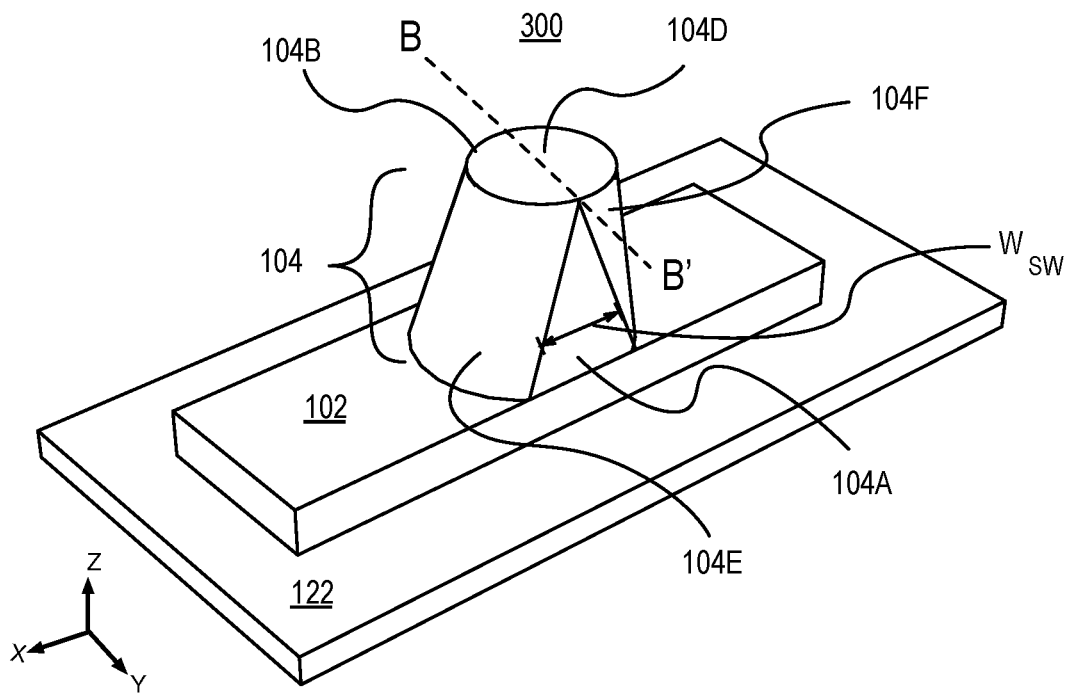
FIG. 3A
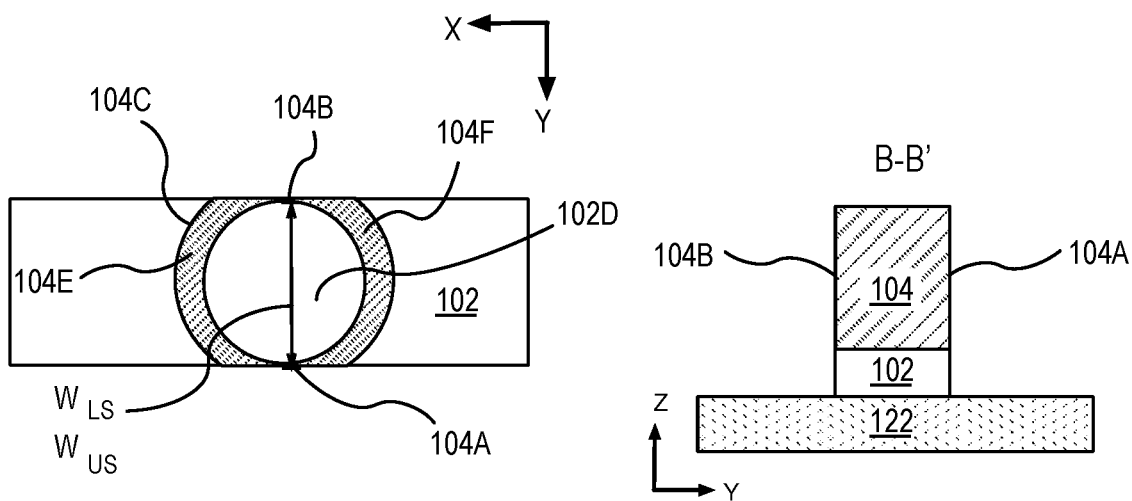
FIG. 3B
FIG. 3C

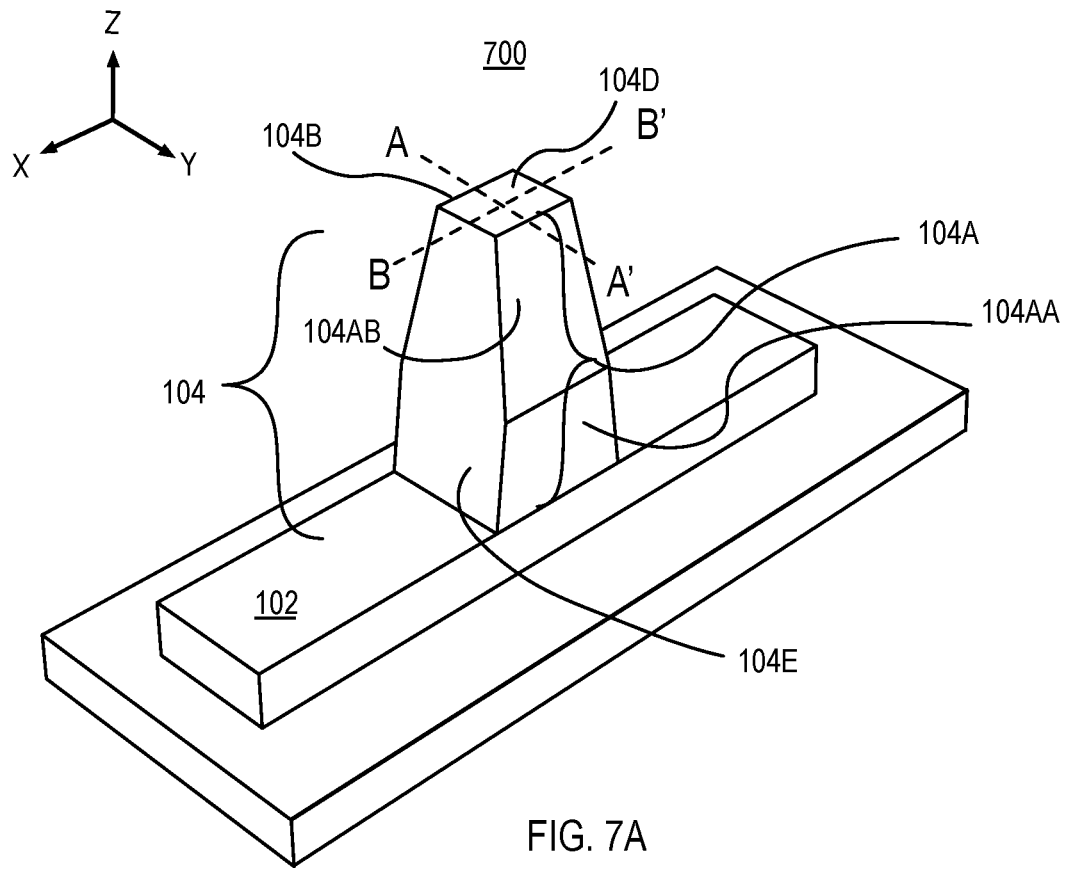
FIG. 7A
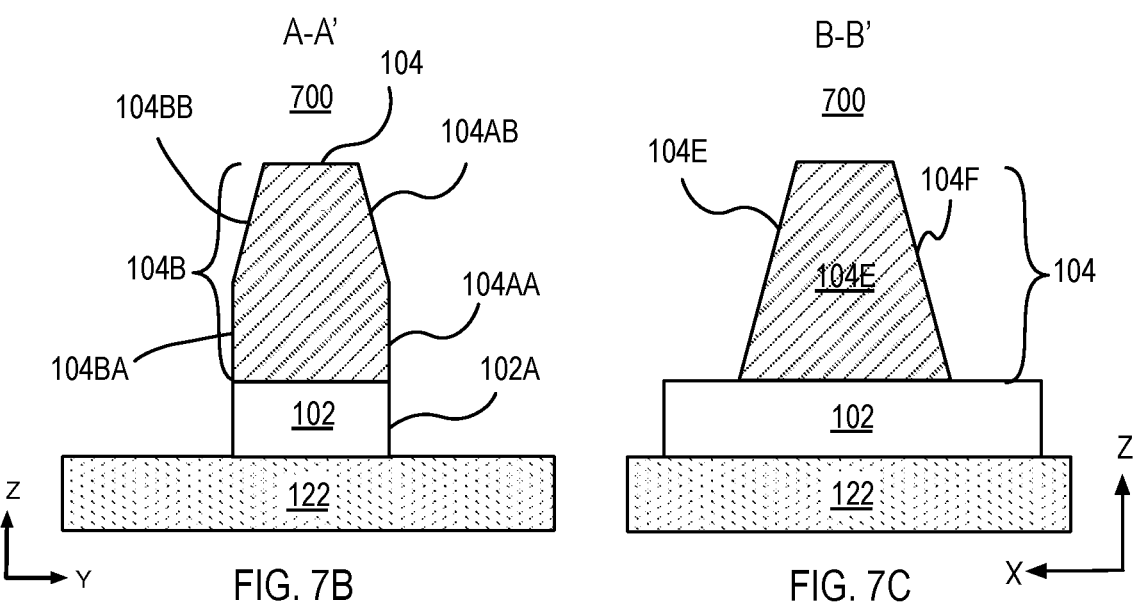
FIG. 7B
FIG. 7C

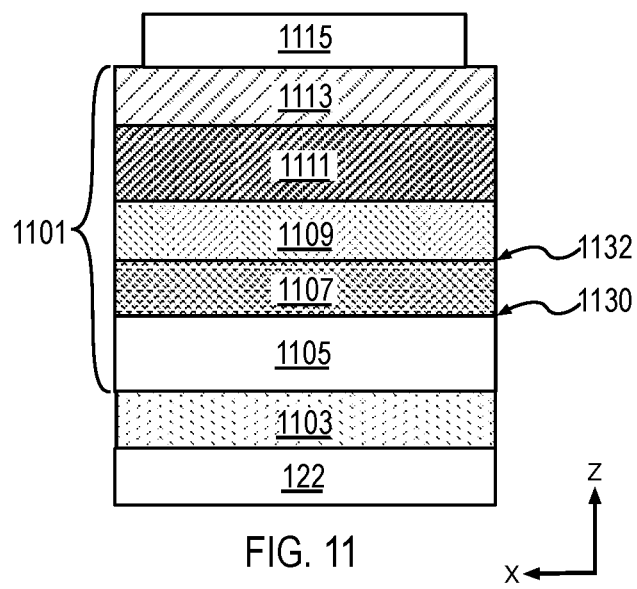
FIG. 11
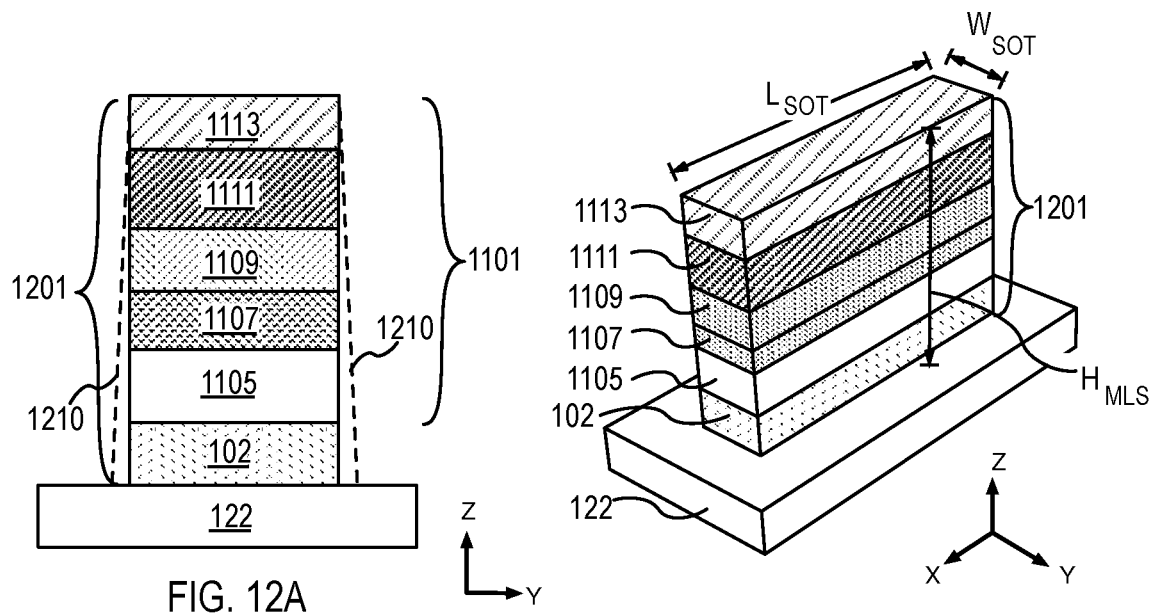
FIG. 12A
FIG. 12B

SPIN ORBIT TORQUE (SOT) MEMORY DEVICES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, integrating magnetic tunnel junction devices with spin orbit torque electrodes is an important area of process development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 3A illustrates an isometric view of a spin orbit torque (SOT) memory device, in accordance with an embodiment of the present disclosure.

FIG. 3B illustrates a plan view of a magnetic tunnel junction (MTJ) device on a spin orbit torque electrode, in accordance with an embodiment of the present disclosure.

FIG. 3C illustrates a cross-sectional view of a magnetic tunnel junction (MTJ) device on a spin orbit torque electrode, through a portion where the MTJ device has sidewalls that are substantially vertical, in accordance with an embodiment of the present disclosure.

FIG. 7A illustrates an isometric view of a spin orbit torque (SOT) memory device, in accordance with an embodiment of the present disclosure.

FIG. 7B illustrates a cross-sectional view of a magnetic tunnel junction (MTJ) device on a spin orbit torque electrode, in accordance with an embodiment of the present disclosure.

FIG. 7C illustrates a cross-sectional view of a magnetic tunnel junction (MTJ) device on a spin orbit torque electrode, through a plane orthogonal to a plane shown in FIG. 7B, in accordance with an embodiment of the present disclosure.

FIG. 11 illustrates a cross-sectional view of a material layer stack for an MTJ device on a layer of spin orbit coupling material, in an accordance with embodiments of the present disclosure.

FIG. 12A illustrates a cross-sectional view of the structure in FIG. 11 following the process of etching the material layer stack to form a block.

FIG. 12B illustrates an isometric view of the block in FIG. 12A.

DESCRIPTION OF THE EMBODIMENTS

Figure 1A:
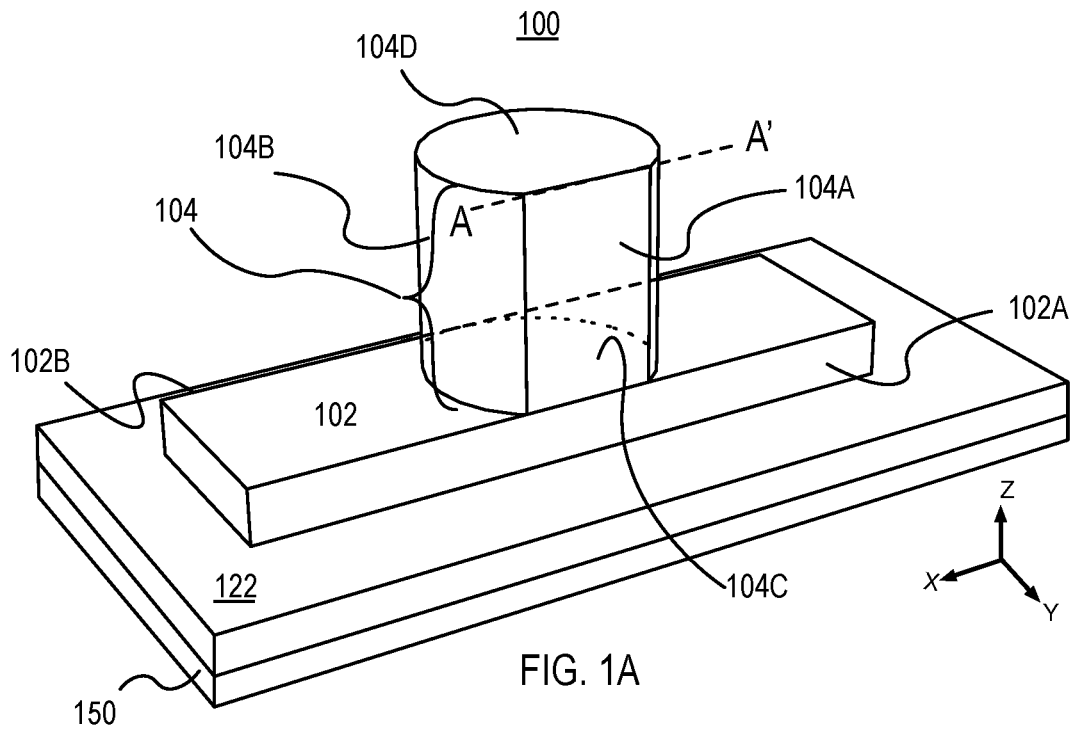
FIG. 1A illustrates an isometric view of a spin orbit torque (SOT) memory device, in accordance with an embodiment of the present disclosure.

Spin orbit torque (SOT) memory devices and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms.

A SOT memory device may include a magnetic tunnel junction (MTJ) device coupled with a spin orbit torque electrode. The MTJ device functions as a memory device where the resistance of the MTJ device switches between a high resistance state and a low resistance state. The resistance state of an MTJ device is defined by the relative orientation of magnetization between a free magnet and a fixed magnet, that is separated from the free magnet by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

In an embodiment, in an absence of a spin orbit torque electrode, resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the spin polarized current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when no current flows through the MTJ device. For this reason, the MTJ device belongs to a class of memory known as non-volatile memory.

As an MTJ device is scaled down in size, the amount of critical spin polarized current density required to switch the device increases. By implementing an MTJ device on a SOT electrode, the magnetization in the free magnet may undergo torque assisted switching from a Spin Hall current, induced by passing an electrical current in a transverse direction, through the SOT electrode. The Spin Hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Electrons of a particular spin polarity are directed toward the MTJ device and impart a spin orbit torque on the magnetization of the free magnet. The spin hall current may also help the MTJ device switch faster. It is to be appreciated that, in an embodiment, the spin hall current can fully switch a free magnet having a magnetization that is oriented in an in-plane direction, even in the absence of a spin polarized current passing through the MTJ device. An in-plane direction is defined as a direction that is parallel to an uppermost surface of the spin orbit torque electrode.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a horizontal plane of the free magnet. In an embodiment, a pMTJ device implemented on an SOT electrode is known as a perpendicular SOT (pSOT) memory device. An external magnetic field may be utilized to help break a symmetry needed to exert a torque to completely switch a perpendicular free magnet in a pMTJ device.

Integrating a non-volatile memory device such as a SOT memory device onto access transistors enables the formation of embedded memory for system on chip (SOC) applications. However, approaches to integrate a SOT memory device onto access transistors presents challenges that have become far more formidable with scaling. One such challenge arises from integrating an MTJ device with a scaled SOT electrode. For instance, patterning a material layer stack using a plasma etch to form a vast array of MTJ devices over SOT electrodes can result in significant etch variation arising from micro and macro loading effects. In some areas the SOT may become over etched and in other areas the MTJ devices may be under etched. Such a plasma etch process may also cause over etch in open unmasked areas and defects, such as micro trenching and under etching, in the vicinity of MTJ devices. Other undesirable features such as footing or tapering of devices may also result preferentially in some devices, resulting in variation in device sizes. However, by patterning a material layer stack for an MTJ device and an underlying SOT material first into blocks and then patterning MTJ devices from the patterned blocks may help to reduce variation between devices. In some embodiments, where aligning MTJ devices to individual devices may impose lithographic challenges, patterning an MTJ from a pre-patterned block may help to alleviate difficulties from misalignment. Furthermore, each MTJ device, in an array of SOT memory devices, may be advantageously self-aligned to a corresponding SOT electrode by orthogonally patterning a line over a plurality of blocks arranged parallel to each other. Such an arrangement may advantageously overcome challenges arising from aligning each individual MTJ device to a corresponding SOT electrode.

FIG. 1A is an illustration of an isometric view of a SOT memory device 100 in accordance with an embodiment of the present disclosure. The spin orbit torque (SOT) memory device 100 includes a SOT electrode 102 including a spin orbit coupling material. The SOT electrode 102 has a first SOT sidewall 102A and a second SOT sidewall 102B opposite to the first SOT sidewall 102A. The SOT memory device 100 further includes a MTJ device 104 on a portion of the SOT electrode 102. The MTJ device 104 has a lowermost MTJ surface 104C having a width that is no greater than a width of the SOT electrode 102. The MTJ device 104 further has at least two sidewalls, where a first MTJ sidewall 104A intersects the first SOT sidewall 102A and where at least a portion of the first MTJ sidewall 104A and the SOT sidewall 102A have a continuous first slope. The MTJ device 104 has a second sidewall 104B, where the second MTJ sidewall 104B does not extend beyond the second SOT sidewall 102B and wherein at least a portion of the second MTJ sidewall 104B has a second slope.

In the illustrative embodiment, an entire MTJ sidewall 104A and the SOT sidewall 102A have a continuous first slope that is vertical or substantially vertical. The MTJ sidewall 104B is concaved and has a slope that is also vertical or substantially vertical. A vertical or substantially vertical sidewall has a slope that is at least 85 degrees. All slopes that are defined to be vertical or substantially vertical, herein have a slope that is at least 85 degrees.

Figure 1B:
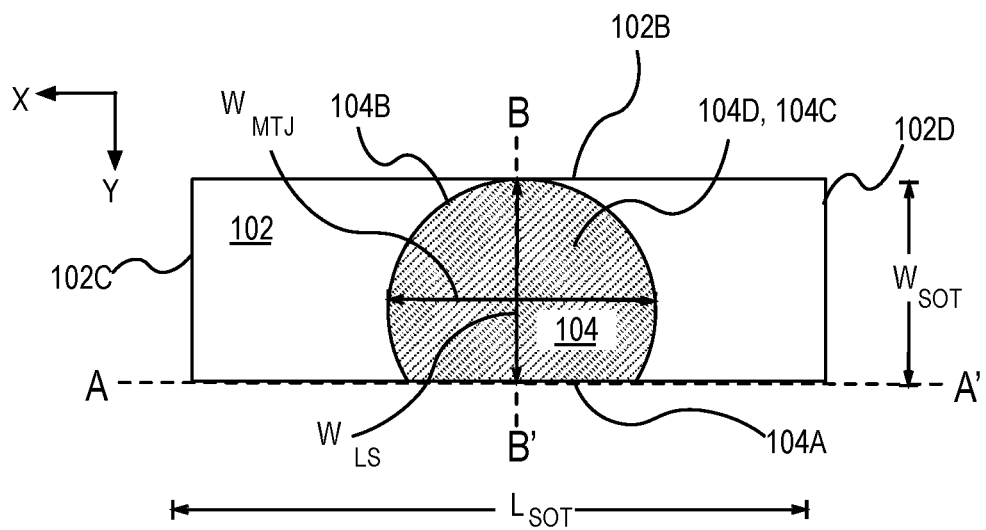
FIG. 1B illustrates a plan view of a magnetic tunnel junction (MTJ) device on a spin orbit torque electrode, in accordance with an embodiment of the present disclosure.
Figure 1C:
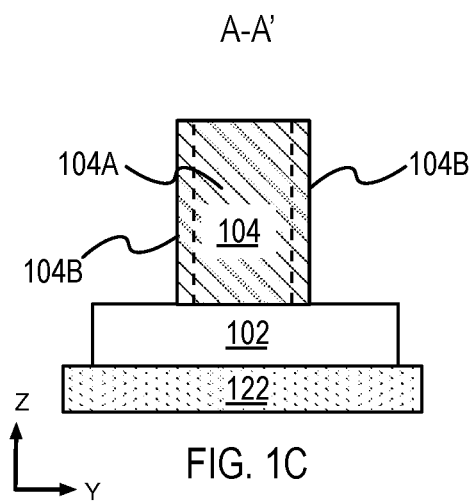
FIG. 1C illustrates a cross-sectional view of a magnetic tunnel junction (MTJ) device on a spin orbit torque electrode, where the MTJ device has curved sidewalls, in accordance with an embodiment of the present disclosure.
Figure 1D:
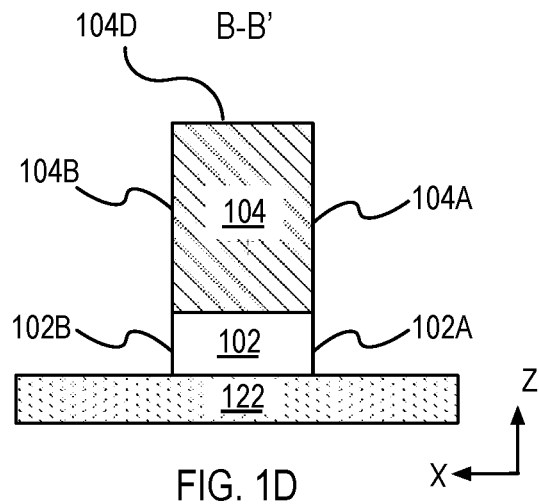
FIG. 1D illustrates a cross-sectional view of a magnetic tunnel junction (MTJ) device on a spin orbit torque electrode, where the MTJ device has a width equal to or substantially equal to a width of the MTJ device, in accordance with an embodiment of the present disclosure.

FIGS. 1B-1D illustrate various plan views and cross-sectional views of the SOT memory device 100, depicted in FIG. 1A.

FIG. 1B illustrates a plan view of the SOT memory device 100. The MTJ device 104 is located within a perimeter of the SOT electrode 102 as is depicted. In an embodiment, the SOT electrode 102 has a rectangular plan view profile, a width given by WsOT and a length given by LsOT. In an embodiment, the first SOT layer has a length, LsOT, between 100 nm-500 nm. In an embodiment, the SOT electrode 102 has a width, WsOT, between 10 nm-50 nm. In the illustrative embodiment, the width of the lowermost MTJ surface WsOT is equal to the width of the SOT electrode, WsOT. In some such examples, the MTJ sidewall 104C is curved and extends to the SOT sidewall 102B as shown. When the lowermost MTJ surface 104C has a width, WLS that spans across an entire width of the SOT electrode 102, the MTJ device 104 may be able to advantageously couple torque from a spin diffusion current generated in the SOT electrode 102. In other embodiments, the curved MTJ sidewall 104C may not extend to the SOT sidewall 102B (not shown). When the MTJ sidewalls 104A and 104B each have a slope that is at least 85 degrees, the MTJ device 104 has an uppermost MTJ surface 104D that has a footprint substantially equal to the footprint of the lowermost MTJ surface 104C, as is indicated in FIG. 1B.

The SOT electrode 102 includes a metal with high degree of spin orbit coupling. A metal with a high degree of spin-orbit coupling has an ability to inject a large spin polarized current in to the free magnet 108. A large spin polarized current can exert a large amount of torque and influence the magnetization of an adjacent free magnet to switch faster. In an embodiment, the SOT electrode 102 includes a metal such as but not limited to tantalum, tungsten, platinum or gadolinium, β-Tantalum β-Ta), Ta, β-Tungsten β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. Layers of 2D materials of $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. A SOT electrode 102 including a beta phase tantalum or beta phase tungsten has a high spin hall efficiency. A high spin hall efficiency denotes that the SOT electrode 102 can generate a large spin hall current for a given charge current through the SOT electrode 102. In an embodiment, the SOT electrode 102 has a thickness between 4 nm and 10 nm.

The MTJ device 104 can have a variety of plan view profiles. A partially circular profile is illustrated in FIGS. 1A and 1B, where the MTJ device has a length, $L_{MTJ}$, that is substantially equal to a diameter of the circle, but less than the length of the SOT electrode 102, LSOT.

In FIG. 1B, the MTJ device 104 is shown to be located substantially at a center of the SOT electrode 102 (along the length or X-direction). The MTJ device 104 may be located anywhere along the length of the SOT electrode 102, between the sidewalls 102C and 102D. An electrical resistance of the SOT electrode 102 may play a role in positioning the MTJ device 104 along the length of the SOT electrode 102. An MTJ device may be advantageously located midway between SOT sidewalls 102C and 102D for minimizing asymmetry in spin diffusion current.

FIG. 1C illustrates a cross sectional view of the SOT memory device 100 through a line A-A' across a face of the sidewall 104A of the MTJ device 104 shown in FIG. 1A. In the illustrative embodiment, the slope of the MTJ sidewall 104B is vertical or substantially vertical. The cross-sectional view also illustrates portions of the curved MTJ sidewall 104B that are adjacent to the MTJ sidewall 104A.

FIG. 1D illustrates a cross sectional view of the SOT memory device 100 through a line B-B' in FIG. 1B. In the illustrative embodiment, the slope of the MTJ sidewall 104A and the SOT sidewall 104A are vertical or substantially vertical and the slopes of the MTJ sidewall 104B and the SOT sidewall 104 are also vertical or substantially vertical. Depending on embodiments, the MTJ device 104 may include a free magnet, a fixed magnet and a tunnel barrier between the free and the fixed magnet. The MTJ device 104 may further include an electrode above the fixed magnet and other intervening magnetic structures such as is described in FIG. 1E below. In such an embodiment, the MTJ sidewalls 104A and 104B are not topographically smooth, as illustrated in FIG. 1D, but have lateral indentations that may vary between the various layers. Such lateral indentations are however less than 2-3% of the width of the MTJ device 104.

Figure 1E:
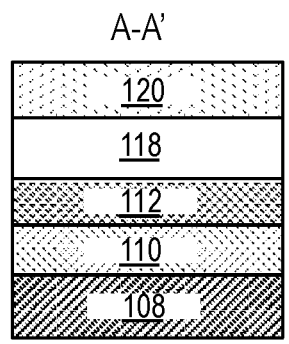
FIG. 1E illustrates a cross-sectional view of various layers in an MTJ, in accordance with an embodiment of the present disclosure.

FIG. 1E is a cross sectional illustration of an MTJ device 104, in an embodiment of the present disclosure. In an embodiment, the MTJ device 104 includes an electrode 120 coupled with a synthetic antiferromagnet (SAF) structure 118, a fixed magnet 112 below the SAF structure 118, a tunnel barrier 110 below the fixed magnet 112, and a free magnet 108 below the tunnel barrier 110. The free magnet 108 of MTJ device 104 is coupled to the SOT electrode 102 (not shown in the Figure).

In an embodiment, the free magnet 108 includes a magnetic material such as Co, Ni, Fe or alloys of these materials. In an embodiment, the free magnet 108 includes a magnetic material such as CoB, FeB, CoFe and CoFeB. In some embodiments, the free magnet 108 includes a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the free magnet 108 is FeB, where the concentration of boron is between 10-40 atomic percent of the total composition of the FeB alloy. In an embodiment, the free magnet 108 has a thickness between 0.9 nm-2.0 nm for perpendicular MTJ devices.

In an embodiment, tunnel barrier 110 includes a material suitable for allowing electron current having a majority spin to pass through tunnel barrier 110, while impeding, at least to some extent, electron current having a minority spin from passing through tunnel barrier 110. Thus, tunnel barrier 110 (or spin filter layer) may also be referred to as a tunneling layer for electron current of a particular spin orientation. In an embodiment, the tunnel barrier 110 includes a material such as, but not limited to, oxygen and at least one of magnesium (e.g., a magnesium oxide, or MgO), or aluminum (e.g., an aluminum oxide such as $Al_2O_3$). In the illustrative embodiment, the tunnel barrier 110 including MgO has a crystal orientation that is (001) and is lattice matched to fixed magnet 112 below the tunnel barrier 110 and free magnet 108 above the tunnel barrier 110. In an embodiment, a free magnet 108 including a $Co_{100-x-y}Fe_xB_y$, is highly lattice matched to the tunnel barrier 110 including an MgO. Lattice matching a crystal structure of the free magnet 108 with the tunnel barrier 110 enables a higher tunneling magnetoresistance (TMR) ratio in the pMTJ device 104. In an embodiment, tunnel barrier 110 is MgO and has a thickness in the range between 1 nm to 2 nm.

In an embodiment, the fixed magnet 112 includes magnetic materials with sufficient perpendicular magnetization. In an embodiment, the fixed magnet 112 of the MTJ device 104 includes alloys such as CoFe, CoFeB, FeB. The alloys of CoFe, CoFeB, FeB may include doping with one or more of Ta, Hf, W, Mo, Ir, Ru, Si or C, to promote high perpendicular anisotropy. Alternatively, the alloys of CoFe, CoFeB, FeB may include thin layers of W, Ta or Molybdenum to promote high perpendicular anisotropy. In an embodiment, the fixed magnet 112 comprises a $Co_{100-x-y}Fe_xB_y$, where X and Y each represent atomic percent, further where X is between 50-80 and Y is between 10-40, and further where the sum of X and Y is less than 100. In one specific embodiment, X is 60 and Y is 20. In an embodiment, the fixed magnet 112 is FeB, where the concentration of boron is between 10-40 atomic percent of the total composition of the FeB alloy. In an embodiment the fixed magnet 112 has a thickness that is between 1 nm-3 nm for perpendicular MTJ devices. When the MTJ 104 is a perpendicular MTJ, the SOT memory device, such as SOT memory device 100 is a perpendicular SOT memory device 100.

Figure 1F:
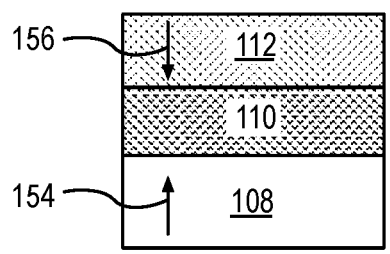
FIG. 1F illustrates a cross-sectional view depicting the direction of magnetization in a free magnet relative to the direction of magnetization in a fixed magnetic layer, in accordance with an embodiment of the present disclosure.

FIG. 1F illustrates a cross-sectional view depicting the free magnet 108 of the MTJ device 104 having a direction of magnetization (denoted by the direction of the arrow 154) that is anti-parallel to a direction of magnetization (denoted by the direction of the arrow 156) in the fixed magnet 112. When the direction of magnetization 154 in the free magnet 108 is opposite (anti-parallel) to the direction of magnetization 156 in the fixed magnet 112, the MTJ device 104 device is said to be in a high resistance state.

Figure 1G:
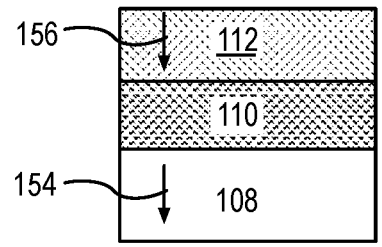
FIG. 1G illustrates a cross-sectional view depicting the direction of magnetization in a free magnet relative to the direction of magnetization in a fixed magnetic layer, in accordance with an embodiment of the present disclosure.

Conversely, FIG. 1G illustrates a cross-sectional view depicting the free magnet 108 of the MTJ device 104 having a direction of magnetization (denoted by the direction of the arrow 154) that is parallel to a direction of magnetization (denoted by the direction of the arrow 156) in the fixed magnet 112. When the direction of magnetization 154 in the free magnet 108 is parallel to the direction of magnetization 156 in the fixed magnet 112, the MTJ device 104 is said to be in a low resistance state.

In an embodiment, the free magnet 108 and the fixed magnet 112 can have approximately similar thicknesses and an injected spin polarized current which changes the direction of the magnetization 154 in the free magnet 108 can also affect the magnetization 156 of the fixed magnet 112. In an embodiment, to make the fixed magnet 112 more resistant to accidental flipping the fixed magnet 112 has a higher magnetic anisotropy than the free magnet 108. To reduce the stray field acting on the free magnet a synthetic antiferromagnetic (SAF) structure may be utilized. Referring once again to FIG. 1E, MTJ device 104 further includes a synthetic antiferromagnetic (SAF) structure 118 between the electrode 120 and the fixed magnet 112.

Figure 1H:
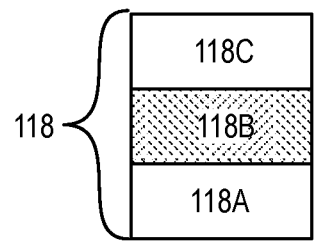
FIG. 1H illustrates a cross-sectional view of individual layers of a synthetic antiferromagnetic structure, in accordance with an embodiment of the present disclosure.

FIG. 1H illustrates a cross-sectional view of the SAF structure 118, in an accordance of an embodiment of the present disclosure. In an embodiment, the SAF structure 118 includes a non-magnetic layer 118B sandwiched between a first pinning ferromagnet 118A and a second pinning ferromagnet 118C as depicted in FIG. 1D. The first pinning ferromagnet 118A and the second pinning ferromagnet 118C are anti-ferromagnetically coupled to each other. In an embodiment, the first pinning ferromagnet 118A includes a layer of a magnetic metal such as Co, Ni, Fe. The first pinning ferromagnet 118A may also include alloys of magnetic metals such as Co, Ni, Fe such as CoFe, CoFeB or FeB. In other embodiments the first pinning ferromagnet 118A includes a bilayer of a magnetic/non-magnetic metals such but not limited to Co/Pd or a Co/Pt. In an embodiment, the second pinning ferromagnet 118C includes a layer of a magnetic metal such as Co, Ni, Fe. The second pinning ferromagnet 118C may also include alloys of magnetic metals such as Co, Ni, Fe such as CoFe, CoFeB or FeB. In other embodiments the second pinning ferromagnet 118C includes a bilayer of a magnetic/non-magnetic metals such but not limited to Co/Pd or a Co/Pt.

In an embodiment, the non-magnetic layer 118B includes a ruthenium or an iridium layer. In an embodiment, a ruthenium based non-magnetic layer 118B has a thickness between 0.3-1.0 nm to ensure that the coupling between the first pinning ferromagnet 118A and the second pinning ferromagnet 118C is anti-ferromagnetic (AF) in nature.

It is to be appreciated that an additional layer of non-magnetic spacer layer may exist between the fixed magnet 112 and the AF structure 118 (not illustrated in FIG. 1A). A non-magnetic spacer layer enables coupling between the SAF structure 118 and the fixed magnet 112. In an embodiment, a non-magnetic spacer layer may include a metal such as Ta, Ru or Ir.

Referring again to FIG. 1E, the MTJ device 104 further includes an electrode 120 on the SAF structure 118. In an embodiment, the electrode 120 includes a material such as Ta or TiN. In an embodiment, the electrode 120 has a thickness between 5-70 nm. In an embodiment, the dielectric layer 122 includes an electrically insulating material such as, but not limited to, silicon dioxide, silicon nitride, silicon carbide, or carbon doped silicon oxide.

Referring again to FIG. 1A, in an embodiment, the substrate 150 includes a suitable semiconductor material such as but not limited to, single crystal silicon, polycrystalline silicon and silicon on insulator (SOI). In another embodiment, substrate 150 includes other semiconductor materials such as germanium, silicon germanium or a suitable group III-N or a group III-V compound. In the illustrative embodiment, the substrate 150 includes a layer of dielectric material above a semiconductor material such as but not limited to, single crystal silicon, polycrystalline silicon, silicon germanium or a suitable group III-N or a group III-V compound. Logic devices such as MOSFET transistors and access transistors and may be formed on the substrate 150. Logic devices such as access transistors may be integrated with memory devices such as SOT memory devices to form embedded memory. Embedded memory including SOT memory devices and logic MOSFET transistors can be combined to form functional integrated circuits such as a system on chip.

Figure 2A:
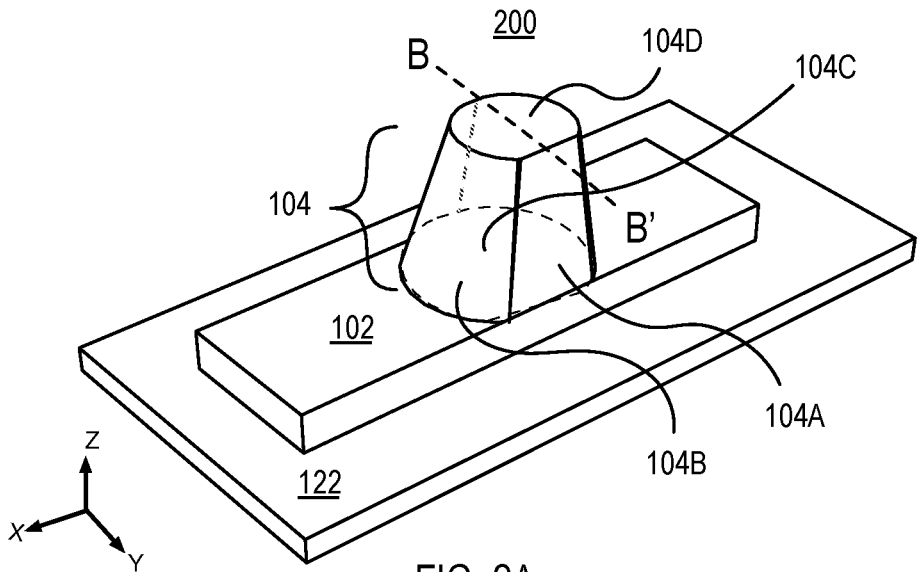
FIG. 2A illustrates an isometric view of a spin orbit torque (SOT) memory device, in accordance with an embodiment of the present disclosure.
Figure 2B:
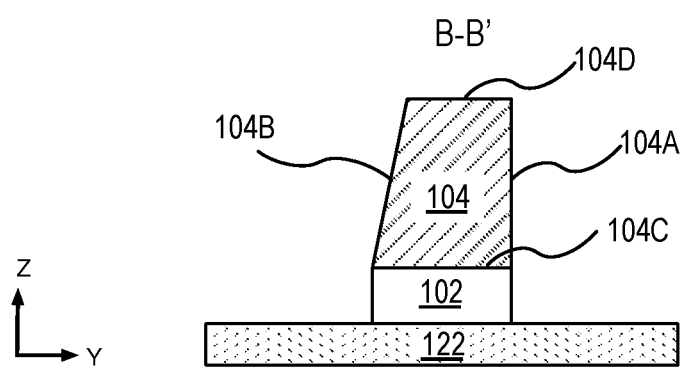
FIG. 2B illustrates a cross-sectional view of a magnetic tunnel junction (MTJ) device on a spin orbit torque electrode, where the MTJ device has a sidewall having a substantially vertical slope and second sidewall having a non-vertical slope, in accordance with an embodiment of the present disclosure.

FIG. 2A illustrates an isometric view of a spin orbit torque (SOT) memory device 200, where the MTJ device 104 has two sidewalls that are each sloped differently. In an embodiment, the first MTJ sidewall 104A has a first slope that is vertical or substantially vertical and a second MTJ sidewall 104B, adjacent to the first MTJ sidewall 104A, that has a slope. The sloped sidewall 104B and the vertical MTJ sidewall 104A are also illustrated in the cross-sectional view of FIG. 2B. In an embodiment, the second MTJ sidewall 104B has a slope that is between 75-85 degrees.

Figure 2C:
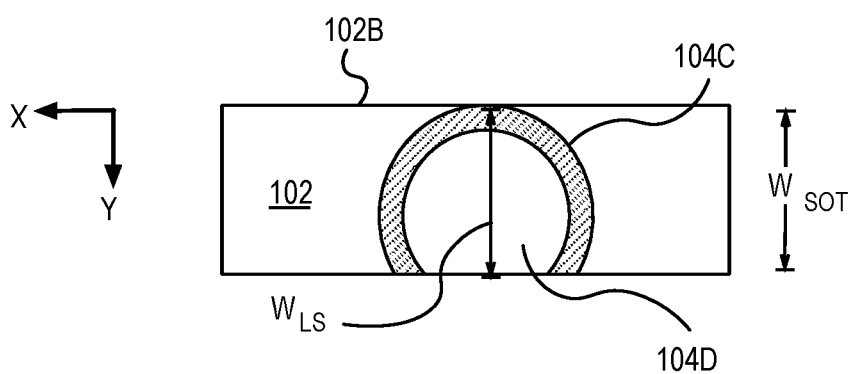
FIG. 2C illustrates a plan view of a magnetic tunnel junction (MTJ) device on a spin orbit torque electrode, in accordance with an embodiment of the present disclosure.

FIG. 2C illustrates a plan view of the SOT memory device 200. In the illustrative embodiment, the width, WLS, of the lowermost MTJ surface 104D is equal to the width of the SOT electrode 102, WSOT. In one example, the uppermost MTJ surface 104D has a footprint that is less than the footprint of the lowermost MTJ surface 104C, as shown.

Referring again to FIG. 2A, the MTJ sidewall 104B has a curved surface and is a result of the shape of the uppermost surface 104D.

FIG. 3A is an illustration of an isometric view of a SOT memory device 300. MTJ device 104 has a first MTJ sidewall 104A that has a vertical slope which is continuous with the slope of the first SOT electrode sidewall 102B. In an embodiment, first MTJ sidewall 104A has a lateral width, $W_{SW}$, that decreases with distance vertically away from the SOT electrode 102. The MTJ device 104 has a second MTJ sidewall 104B, opposite to the MTJ sidewall 104A, that has one or more features of the MTJ sidewall 104A.

In the illustrative embodiment, the MTJ device 104 further includes a third MTJ sidewall 104E adjacent and between both the MTJ sidewall 104A and the MTJ sidewall 104B. The MTJ device 104 also has a fourth MTJ sidewall 104F that is adjacent and between both the MTJ sidewall 104A and the MTJ sidewall 104B but opposite to the MTJ sidewall 104E. In an embodiment, the MTJ sidewalls 104E and 104F, have a third slope. In one example as shown, the MTJ sidewalls 104E and 104F have a third slope that is sloped between 75 to 85 degrees with respect to a plane of the uppermost MTJ surface 104D.

FIG. 3B illustrates a plan view of the SOT memory device 300, depicted in FIG. 3A. In the illustrative embodiment, the uppermost surface 104D has a shape that is different from the lowermost surface 104C. As show, the uppermost surface 104D has a circular profile and the lowermost surface 104C has a partially circular profile. The lowermost MTJ surface 104C has a width, WLS, and the uppermost MTJ surface 104D has a width $W_{US}$. In an embodiment, WLS is equal or substantially equal to $W_{US}$ and to the width of the SOT electrode 102, WSOT.

As shown in the cross-sectional illustration of FIG. 3C, the MTJ sidewall 104A and the MTJ sidewall 104B each have a slope that is substantially vertical, when the cross-section is taken along a diameter, in a B-B' direction, as shown in the FIG. 3A.

Figure 4A:
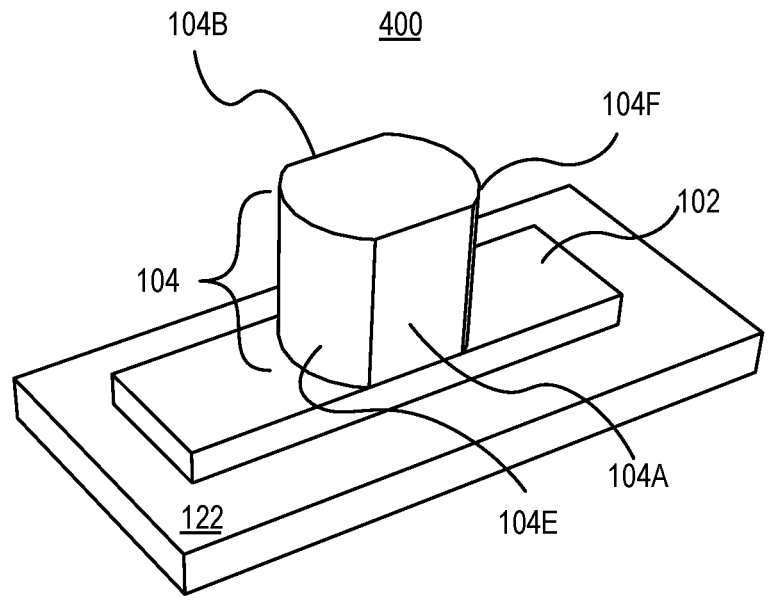
FIG. 4A illustrates an isometric view of a spin orbit torque (SOT) memory device, in accordance with an embodiment of the present disclosure.

FIG. 4A illustrates an isometric view of a spin orbit torque (SOT) memory device 400, where the MTJ device 104 has four sidewalls. In one such embodiment, the first MTJ sidewall 104A has a first slope and the second MTJ sidewall 104B, which is opposite and parallel to the first MTJ sidewall 104A, also has the first slope, where the first slope is vertical or substantially vertical. The MTJ device 104 further includes a third MTJ sidewall 104E, adjacent and between both the first MTJ sidewall 104A and the MTJ sidewall 104B. The MTJ device 104 also has a fourth MTJ sidewall 104F that is adjacent and between the MTJ sidewall 104A and the second MTJ sidewall 104B but opposite to the third MTJ sidewall 104E. In an embodiment, the MTJ sidewalls 104E and 104F have a third slope. In the illustrated example, the MTJ sidewalls 104E and 104F have a third slope that is vertical or substantially vertical.

Figure 4B:
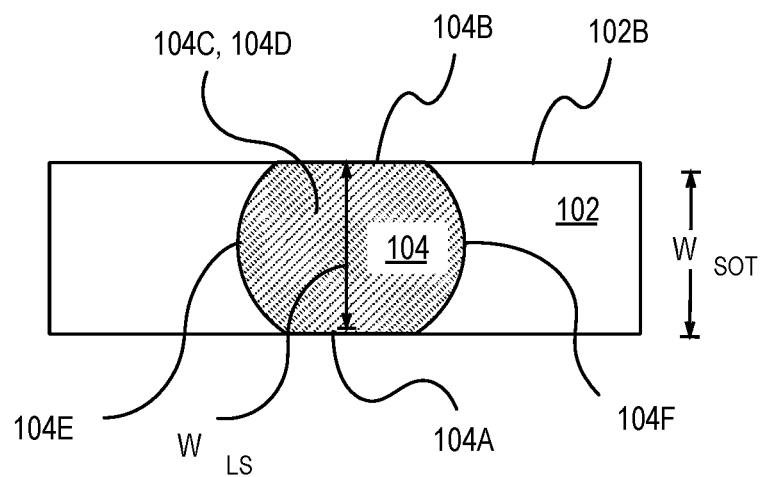
FIG. 4B illustrates a plan view of a magnetic tunnel junction (MTJ) device on a spin orbit torque electrode, in accordance with an embodiment of the present disclosure.

As shown in the plan view illustrations of FIG. 4B the width, WLS, of the lowermost MTJ surface 104D is equal to the width of the SOT electrode 102, WSOT. In the illustrative embodiment, the uppermost MTJ surface 104D has a footprint that is the same or substantially the same than the footprint of the lowermost MTJ surface 104C.

Figure 5:
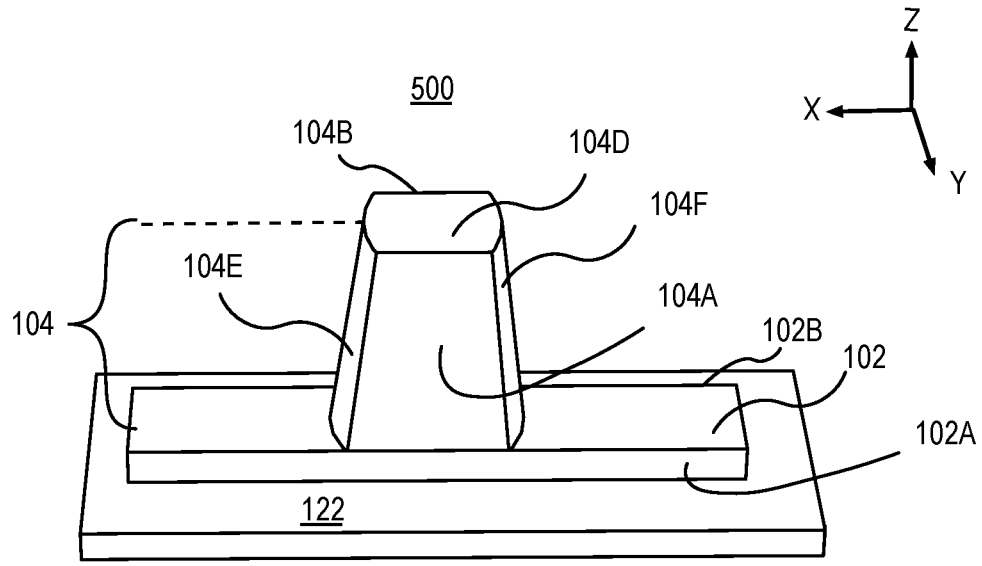
FIG. 5 illustrates an isometric view of a spin orbit torque (SOT) memory device, in accordance with an embodiment of the present disclosure.

FIG. 5 illustrates an SOT memory device 500 including a MTJ device 104 having MTJ sidewalls 104E and 104F that are curved and sloped. In some examples the slope may range between 75 to 85 degrees with respect to the uppermost MTJ surface 104D. The MTJ sidewalls 104A and 104B (opposite to sidewall 104A) each have slopes that are vertical or substantially vertical. In the illustrative embodiment, the uppermost MTJ surface 104D has a footprint that is smaller than a footprint of the lowermost MTJ surface (not visible in Figure).

Sidewall 104A is continuous with SOT sidewall 102A. In an embodiment, SOT sidewall 102A and MTJ sidewall 104A each have a slope that is vertical or substantially vertical. In an embodiment, sidewall 104B is continuous with SOT sidewall 102B. In one such embodiment, SOT sidewall 102B and MTJ sidewall 104B each have a slope that is vertical or substantially vertical.

Figure 6:
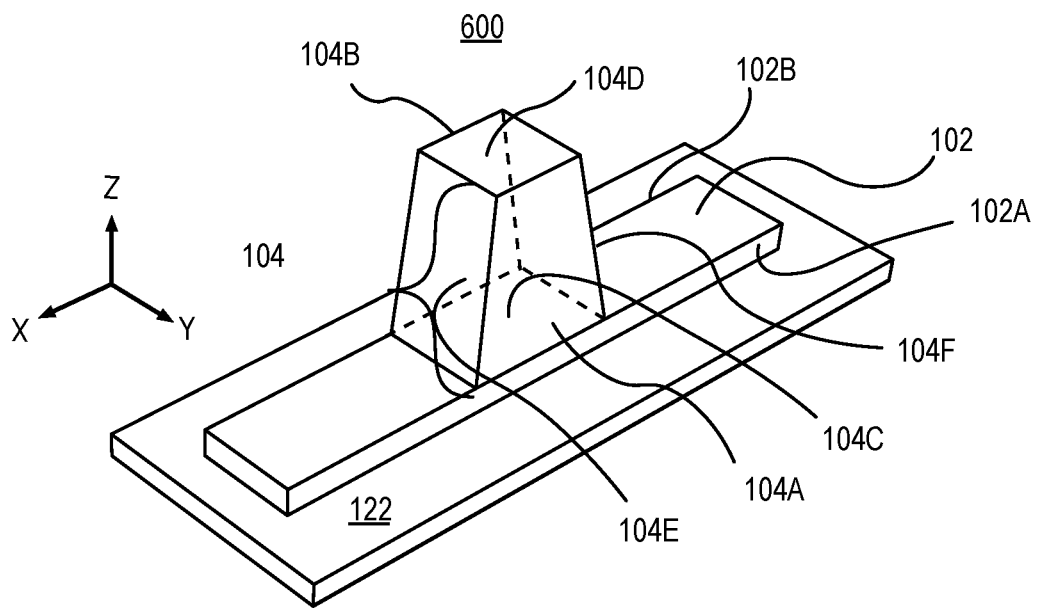
FIG. 6 illustrates an isometric view of a spin orbit torque (SOT) memory device, in accordance with an embodiment of the present disclosure.

FIG. 6 illustrates an SOT memory device 600 including a MTJ device 104 having MTJ sidewalls 104E and 104F that are sloped but not curved. In such an embodiment, the uppermost MTJ surface 104D has a rectangular profile as illustrated in FIG. 6A. The MTJ sidewalls 104A and 104B (opposite to sidewall 104A) each have slopes that are vertical or substantially vertical.

Sidewall 104A is continuous with SOT sidewall 102A. In an embodiment, SOT sidewall 102A and MTJ sidewall 104A each have a slope that is vertical or substantially vertical. In an embodiment, sidewall 104B is continuous with SOT sidewall 102B. In one such embodiment, SOT sidewall 102B and MTJ sidewall 104B each have a slope that is vertical or substantially vertical.

In the illustrative embodiment, the uppermost MTJ surface 104D has a footprint that is smaller than a footprint of the lowermost MTJ surface 104C.

FIG. 7A illustrates an isometric view of a spin orbit torque (SOT) memory device 700 where a first portion 104AA of the first MTJ sidewall 104A has a first slope and a second portion 104AB of the first MTJ sidewall 104A has a fourth slope. In an embodiment, the first slope is vertical or substantially vertical and the fourth slope is between 75 degrees and 85 degrees with respect to the uppermost MTJ surface 104D. In some examples where the uppermost MTJ surface 104D has a rectangular profile, the MTJ device 104 also has a third MTJ sidewall 104E adjacent to and in between the first sidewall 104A and the second sidewall 104B.

FIG. 7B is a cross-sectional view of the SOT device 700 through the line A-A' in FIG. 7A and illustrates the structure of MTJ sidewall 104B that is opposite to the MTJ sidewall 104A. In the illustrative embodiment, MTJ sidewall 104B is substantially symmetric to MTJ sidewall 104A. For example, the second MTJ sidewall 104B has a first portion 104BA that has the first slope and a second portion 104BB that has the fourth slope. The sidewall portion 104AA has a slope that is equal to or substantially equal to the slope of the SOT sidewall 102A.

FIG. 7C is a cross-sectional view of the SOT device 100 through the line B-B' in FIG. 7A and illustrates a fourth MTJ sidewall 104F opposite to the third MTJ sidewall 104E. In the illustrative embodiment, MTJ sidewall 104E is substantially symmetric to MTJ sidewall 104F and has the fourth slope. The MTJ sidewall 104F is adjacent to and in between the MTJ sidewalls 104A and 104B (not shown in the Figure). In an embodiment, the fourth slope is between 75-85 degrees.

Figure 8A:
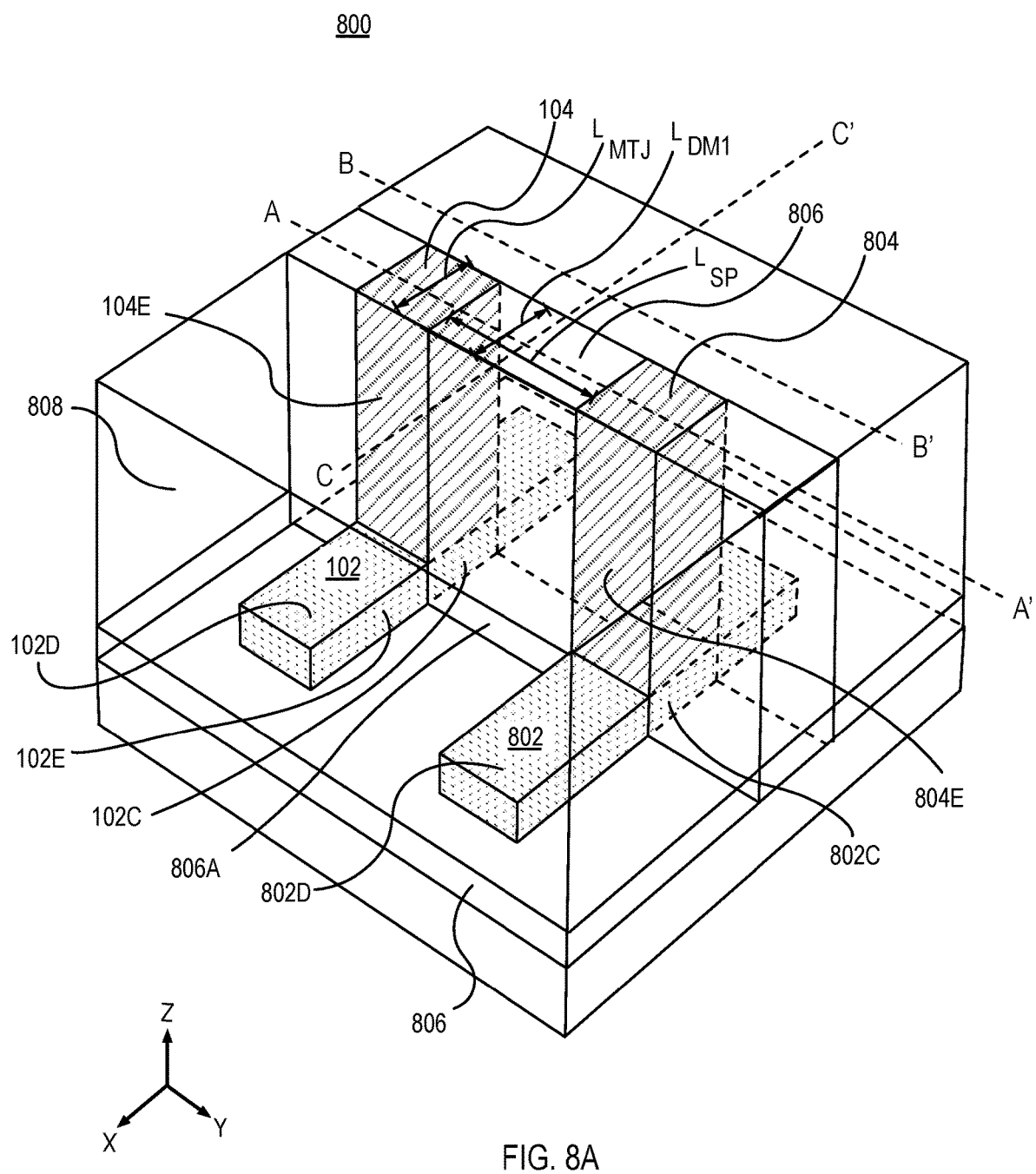
FIG. 8A illustrates an isometric view of an array structure including a first and a second spin orbit torque (SOT) memory devices, in accordance with an embodiment of the present disclosure.
Figure 8B:
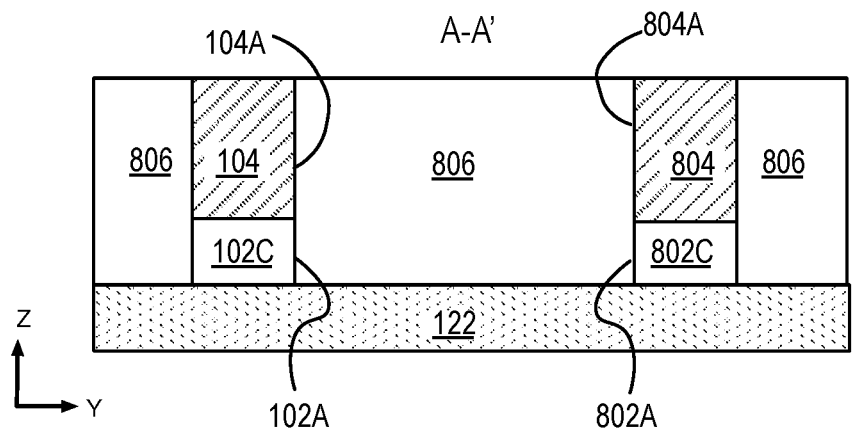
FIG. 8B illustrates a cross-sectional view of a first magnetic tunnel junction (MTJ) device on a first spin orbit torque electrode and a second MTJ device on a second spin orbit torque electrode, and a dielectric material between the first MTJ device and the second MTJ device, in accordance with an embodiment of the present disclosure.

FIG. 8A is an illustration of an isometric view of a memory array structure 800. In an embodiment, memory array structure 800 includes a first SOT electrode 102 and a second SOT electrode 802, where the first and second SOT electrodes 102 and 802 each have a length in a first direction (along X-axis). The memory array structure 800 further includes a first MTJ device 104 over a first portion 102C of the length of the first SOT electrode 102 and a second MTJ device 804 over a first portion 802C of the length of the second SOT electrode 802. In the illustrative embodiment, the first portion 102C is a center portion of the SOT electrode 102, and the second portion 102D is an end portion of the SOT electrode 102 and first portion 802C is a center portion of the SOT electrode 802, and the second portion 802D is an end portion of the SOT electrode 802. A first dielectric material 806 is adjacent to a MTJ sidewall 104A of the MTJ device 102, and adjacent to a MTJ sidewall 804A of the MTJ device 804 as shown in the cross-sectional illustration of FIG. 8B. Also, as shown in FIG. 8B, the first dielectric material 806 is adjacent to a sidewall 102A of the first portion 102C of SOT electrode 102, and adjacent to a sidewall 802A of the first portion 802C of SOT electrode 802. Referring again to FIG. 8A, a second dielectric material 808 is adjacent to a second MTJ sidewall 104E and a second MTJ sidewall 804E, where the second dielectric material 808 is over a second portion 102D of the length of the first SOT electrode 102, and over a second portion 802D of the length of the second SOT electrode 802. Furthermore, the second dielectric material 808 is also adjacent to a sidewall 806A of the first dielectric material 806 that is between the first and second MTJ devices 104 and 804.

Figure 8C:
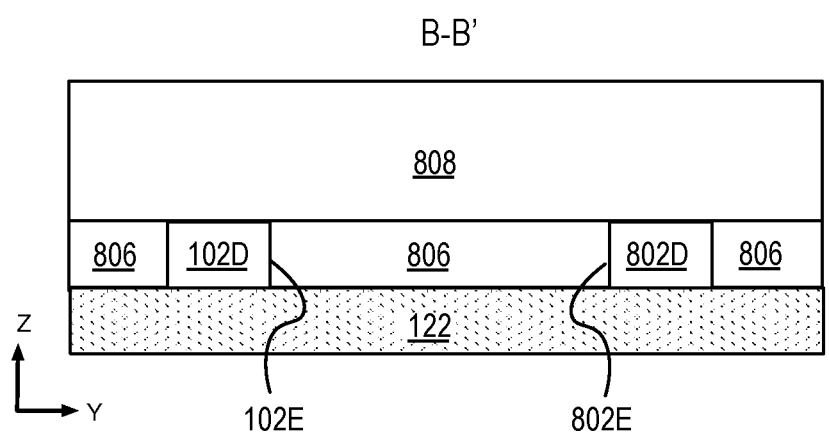
FIG. 8C illustrates a cross-sectional view of a first dielectric layer between the first SOT electrode and the second SOT electrode, and a second dielectric layer on the first SOT electrode and second SOT electrode and on the first dielectric layer, in accordance with an embodiment of the present disclosure.

As shown in the cross-sectional illustration of FIG. 8C (taken along the line B-B' in FIG. 8A), the first dielectric material 806 is adjacent to a sidewall 102E of the second portion 102C of the SOT electrode 102 and also adjacent to a sidewall 802E of the second portion 802C of the SOT electrode 802. The second dielectric material 808 is over the first dielectric material 806 that is adjacent to the sidewall 102E of the second portion 102D of the first SOT electrode 102, and adjacent to the sidewall 802E of the second portion 802D of the second SOT electrode 802, respectively.

Figure 8D:
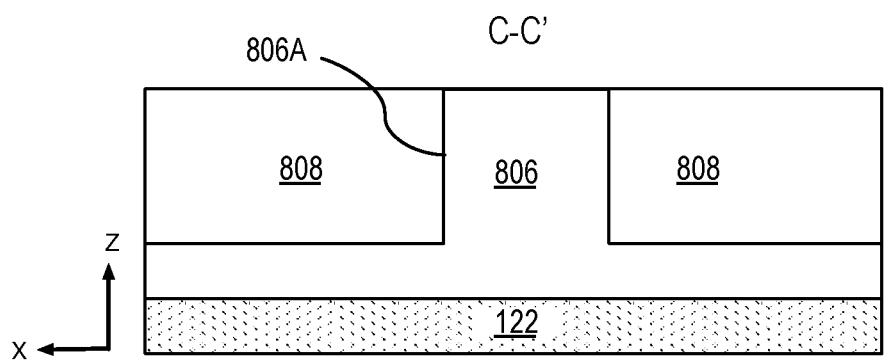
FIG. 8D illustrates a cross-sectional view through a plane between the first MTJ device and the second MTJ device, of the array structure in FIG. 8A, in accordance with an embodiment of the present disclosure.

FIG. 8D is a cross sectional view of the memory array structure 800 through the line C-C' in FIG. 8A. In an embodiment the first dielectric layer 806 is below the second dielectric layer 808. In such an example, the second dielectric material 808 is adjacent to the sidewall 806A of the first dielectric material 806.

As shown in FIG. 8A, the first dielectric layer 806 has a length, $L_{DM1}$, in the first direction (Y axis) that is substantially equal to length, $L_{MTJ}$, of the first and second MTJ devices 104 and 810, respectively, in the first direction. The first dielectric layer 806 has a second length, $L_{SP}$, in a second direction, orthogonal to the first direction, that is substantially equal to a space between the first and second MTJ devices 104 and 810, respectively, as shown.

In an embodiment, the first and second dielectric layers 806 and 808, respectively, have the same or substantially the same material composition. In some examples, the first and second dielectric layers 806 and 808 include a material such as but not limited to silicon dioxide, silicon nitride, silicon carbide, carbon doped silicon oxide or carbon doped silicon nitride. In other embodiments, the first and second dielectric layers 806 and 808 have different material compositions.

In an embodiment, such as in the illustration in FIGS. 8A and 8B, the MTJ structures each have four sidewalls that are substantially vertical. In other examples, the MTJ sidewalls 104E and 804E may be tapered or have a non-vertical slope. The MTJ devices 104 and 804 may have sidewalls 104E and 804E whose slopes may depend on the methodology adopted to pattern the MTJ structure as well as on the size and shape of the MTJ device.

Figure 9A:
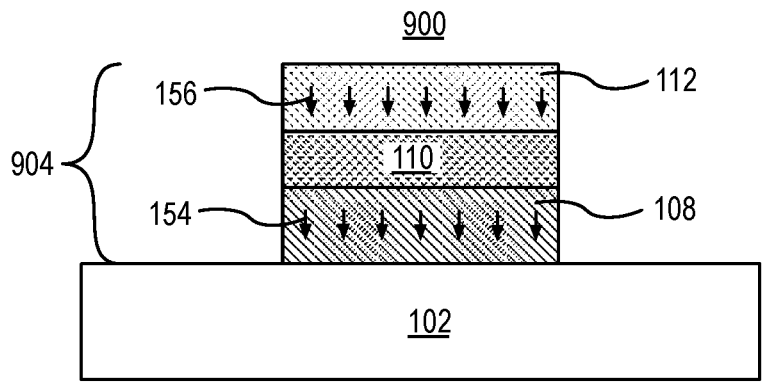
FIG. 9A illustrates a SOT memory device in a low resistance state.
Figure 9B:
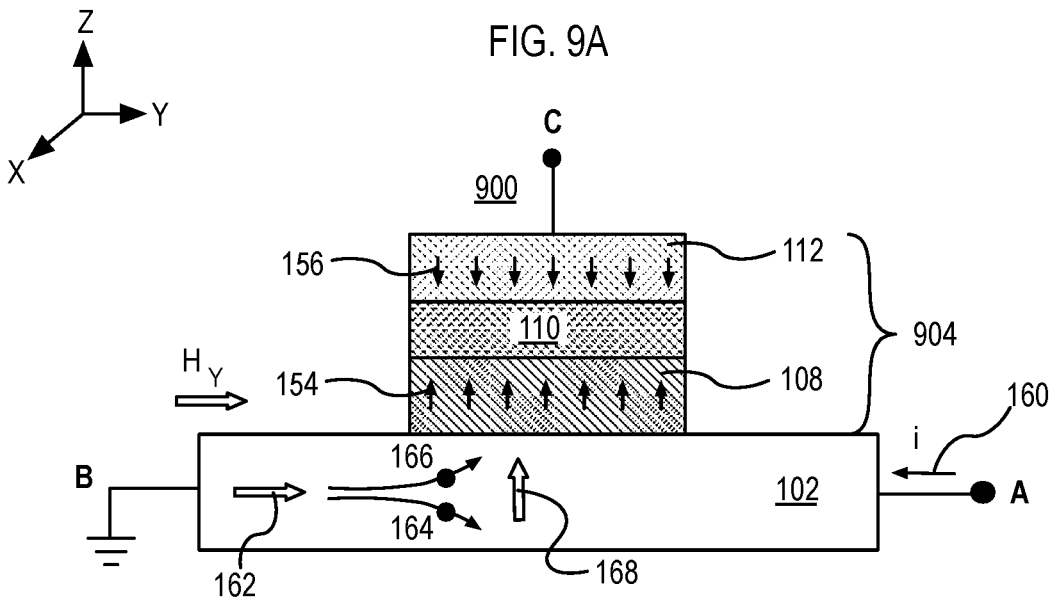
FIG. 9B illustrates a SOT memory device switched to a high resistance state after the application of a spin hall current, a spin torque transfer current and/or an external magnetic field.
Figure 9C:
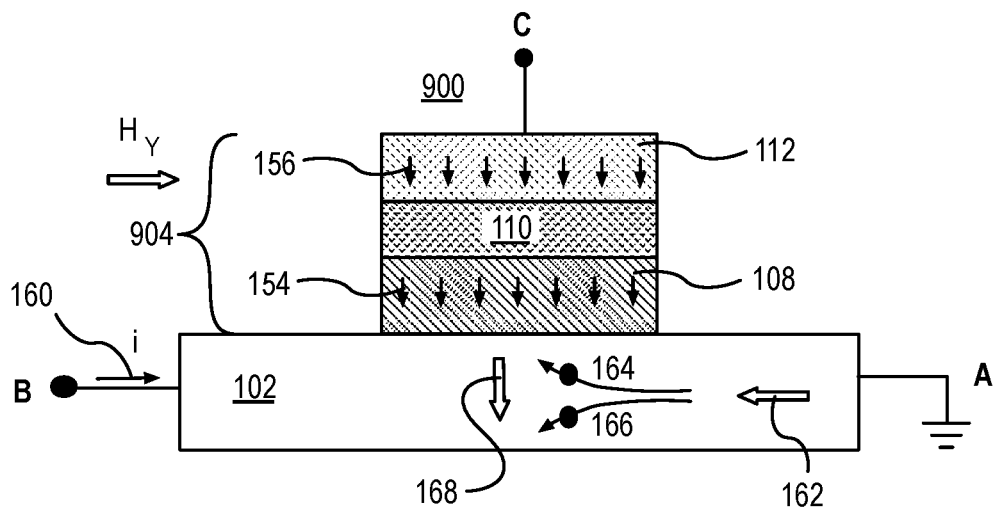
FIG. 9C illustrates a SOT memory device switched to a low resistance state after the application of a spin hall current, a spin torque transfer current and/or an external magnetic field.

FIGS. 9A-9C illustrate a mechanism for switching a spin orbit torque (SOT) memory device such as a spin orbit torque (SOT) memory device 900 including a MTJ device 904 on the SOT electrode 102 including the first SOT layer 106 and the second SOT layer 114. In the illustrative embodiment, the MTJ device 904 includes one or more features of the MTJ device 104, such as the free magnet 108, the fixed magnet 112 and the tunnel barrier 110 between the free magnet 108, the fixed magnet 112.

FIG. 9A illustrates a SOT memory device 900 including the MTJ device 904 on the SOT electrode 102, where a magnetization 154 of the free magnet 108 is aligned in a direction parallel to the magnetization 156 of the fixed magnet 112. In an embodiment, the direction of magnetization 154 of the free magnet 108 and the direction of magnetization 156 of the fixed magnet 112 are both in the negative Z-direction as illustrated in FIG. 9A. As discussed above, when the magnetization 154 of the free magnet 108 is in the same direction as a magnetization 156 of the fixed magnet 112, MTJ device 904 is in a low resistance state.

FIG. 9B illustrates the MTJ device 904 of the spin orbit torque (SOT) memory device 900 switched to a high resistance state. In an embodiment, a reversal in the direction of magnetization 154 of the free magnet 108 in FIG. 9B relative to the direction of magnetization 154 of the free magnet 108 in FIG. 9A is brought about by (a) inducing a spin diffusion current 168 in the SOT electrode 102 in the Y-direction, (by applying a positive voltage bias on terminal A with respect to a grounded terminal B), and/or (c) by applying an external magnetic field, $H_y$, 170 in the Y-direction.

In an embodiment, a charge current 160 is passed through the SOT electrode 102 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the SOT electrode 102. The spin dependent scattering phenomenon is brought about by a spin-orbit interaction between the nucleus of the atoms in the SOT electrode 102 and the electrons in the electron current 162. The spin dependent scattering phenomenon causes type I electrons 166, whose spins are oriented in the negative x-direction (into the page of FIG. 9B), to be deflected upwards towards an uppermost portion of the SOT electrode 102 and type II electrons 164 whose spins are oriented in the positive X-direction to be deflected downwards towards a lowermost portion of the SOT electrode 102. The separation between the type I electrons 166 and the type II electrons 164 induces a polarized spin diffusion current 168 in the SOT electrode 102. In an embodiment, the polarized spin diffusion current 168 is directed upwards toward the free magnet 108 of the MTJ device 104, as is depicted in FIG. 9B. The polarized spin diffusion current 168 induces a Spin Hall torque on the magnetization 154 of the free magnet 108. In an embodiment, a torque can also be exerted on the magnetization 154 of the free magnet 108 by applying an external magnetic field, $H_y$, in the Y-direction, as illustrated in FIG. 9B. In the illustrative embodiment, the external magnetic field, $H_y$, provides a torque component (in the positive Z direction) to switch the magnetization 154 of the free magnet 108.

FIG. 9C illustrates the MTJ device 104 of the spin orbit torque (SOT) memory device 900 switched to a low resistance state. In an embodiment, a reversal in the direction of magnetization 154 of the free magnet 108 in FIG. 9C compared to the direction of magnetization 154 of the free magnet 108 in FIG. 9B is brought about by (a) reversal in the direction of the spin diffusion current 168 in the SOT electrode 102 (by applying a positive voltage bias on terminal B with respect to a grounded terminal A), and/or (b) by applying an external magnetic field, $H_y$, 170 in the negative Y-direction. In some embodiments, the direction of the external magnetic field, $H_y$ is not reversed (not shown.)

A read operation to determine a state of the MTJ device 104 may be performed by voltage biasing a third terminal C, connected to the fixed magnet 112 with respect to the either terminal and A and B, where the terminals A or B are grounded (not illustrated).

Figure 10:
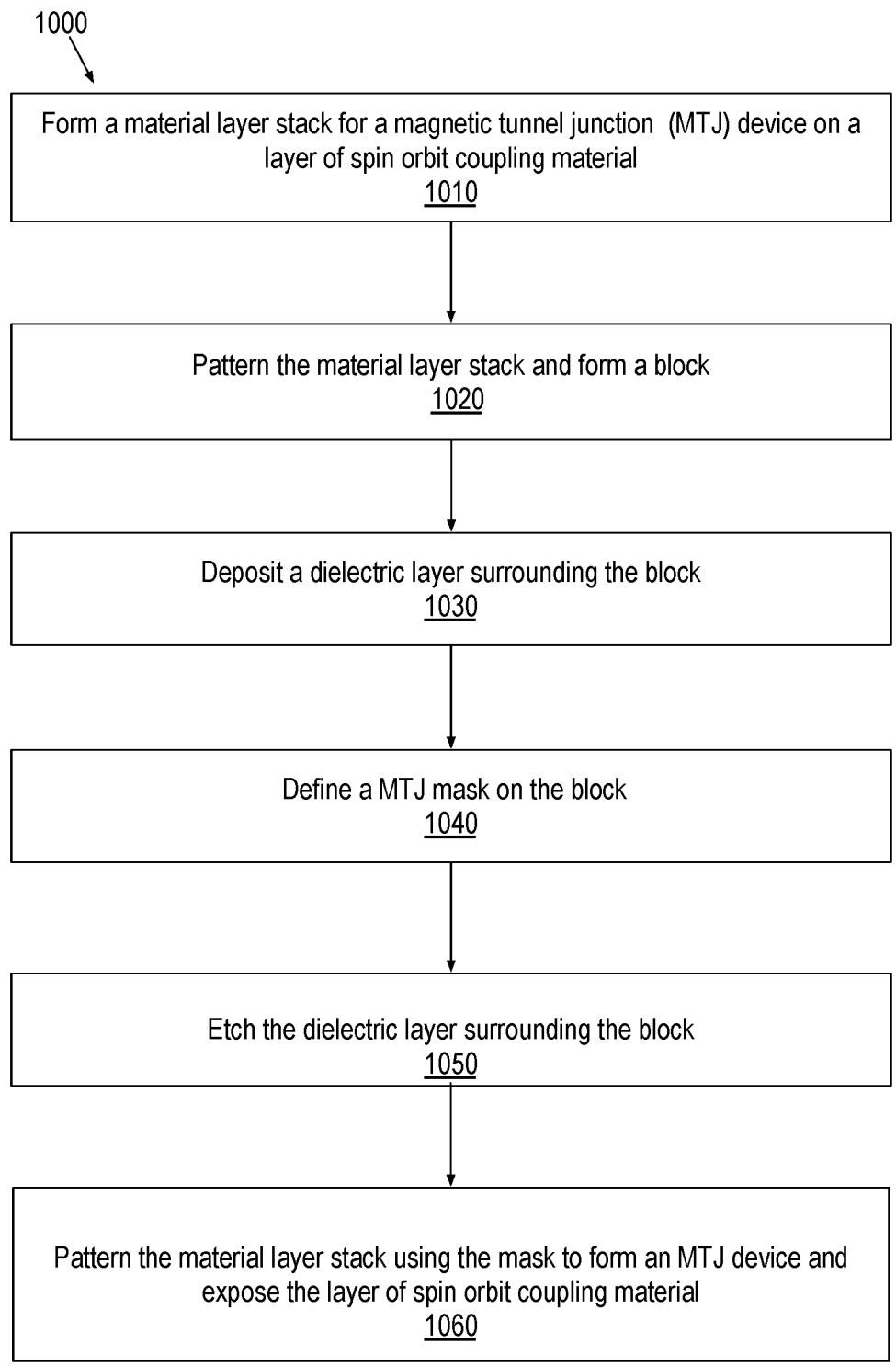
FIG. 10 is a flow diagram depicting a method to fabricate a SOT memory device, in accordance with an embodiment of the present disclosure.

FIG. 10 illustrates a flow diagram of a method to fabricate a SOT memory device such as the SOT memory device 100 illustrated in FIG. 1A. The method 1000 begins at operation 1010 with the formation of a MTJ material layer stack on a layer of spin orbit coupling (SOC) material. In exemplary embodiments, all layers in the material layer stack and the layer of spin orbit coupling material are deposited in-situ without breaking vacuum. In a simplest embodiment, forming the material layer stack includes a deposition of a free magnetic layer on the layer of spin orbit coupling material, deposition of a tunnel barrier layer over the free magnetic layer, deposition of a fixed magnetic layer over the tunnel barrier layer, deposition of layers of a synthetic antiferromagnetic (SAF) structure over the fixed magnetic layer, and deposition of a conductive layer on the layers of a SAF structure to complete deposition of the MTJ material layer stack. The method 1000 is continued at operation 1020 with patterning of the MTJ material layer stack, and the layer of SOC material to form a block. The method 1000 is continued at operation 1030 with the formation of a layer of dielectric material surrounding the block. The method 1000 is continued at operation 1040 with the formation of a mask on the block to pattern a portion of the block into a magnetic tunnel junction. The method 1000 is continued at operation 1050 to pattern the dielectric layer surrounding the block. The method 1000 is continued at operation 1060 to partially pattern the block to form a MTJ device using the mask and stop on the layer of SOC material.

FIGS. 11-17 illustrate isometric and cross-sectional views representing various operations in a method of fabricating a SOT memory device, such as the SOT memory device 400, in accordance with embodiments of the present disclosure.

FIG. 11 illustrates a cross-sectional view of a material layer stack 1101 for the formation of a magnetic tunnel junction memory device on a layer of spin orbit coupling material. The deposition process begins by first depositing a layer of SOC material 1103 above a dielectric layer 122. In an embodiment, a free magnetic layer 1105 is deposited on the layer of SOC material 1103. In an embodiment, the free magnetic layer 1105 is deposited using a PVD process or a plasma enhanced chemical vapor deposition (PECVD) process. In an embodiment, the free magnetic layer 1105 includes a material that is the same or substantially the same as the material of the free magnet 108. In an embodiment, the deposition process forms a free magnetic layer 1105 including CoFeB that is amorphous. In an embodiment, the free magnetic layer 1105 is deposited to a thickness between 0.9 nm-2.0 nm to fabricate a perpendicular MTJ device. During an in-situ deposition process, a tunnel barrier layer 1107 is then formed on the free magnetic layer 1105, a fixed magnetic layer 1109 is formed on the tunnel barrier layer 1107, layers of a SAF structure 1111 are formed on the fixed magnetic layer 1109 and a conductive layer 1113 is formed on the layers of a SAF structure 1111 to complete formation of a MTJ material layer stack 1101.

In some embodiments, a tunnel barrier layer 1107 is blanket deposited on the free magnetic layer 1105. In an embodiment, the tunnel barrier layer 1107 is a material including magnesium and oxygen or a material including aluminum and oxygen. In an exemplary embodiment, the tunnel barrier layer 1107 is a layer of MgO and is deposited using a reactive sputter process. In an embodiment, the reactive sputter process is carried out at room temperature. In an embodiment, the tunnel barrier layer 1107 is deposited to a thickness between 0.8 nm to 1 nm. In some examples, the deposition process is carried out in a manner that yields a tunnel barrier layer 1107 having an amorphous structure. In some such examples, the amorphous tunnel barrier layer 1107 becomes crystalline after performing a high temperature anneal process to be described further below. In other embodiments, the tunnel barrier layer 1107 is crystalline as deposited.

In an embodiment, the fixed magnetic layer 1109 is blanket deposited on an uppermost surface of the tunnel barrier layer 1107. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 1109 is $Co_{100-x-y}Fe_xB_y$, where X and Y each represent atomic percent, further where X is between 50-80 and Y is between 10-40, and further where the sum of X and Y is less than 100. In some embodiments, the fixed magnetic layer 1109 includes a material that is the same or substantially the same as the material of the fixed magnet 116 described above. In some examples, the fixed magnetic layer 1109 may be deposited to a thickness between 2.0 nm and 3.0 nm. A thickness range between 2.0 nm and 3.0 nm may be sufficiently thin to provide perpendicular magnetic anisotropy required to fabricate a perpendicular SOT memory device.

In the illustrative embodiment, the material layer stack deposition process is continued with deposition of layers utilized to form a SAF layer 1111. In some embodiments, the layers of a SAF structure 1111 are blanket deposited on the fixed magnetic layer 1109 using a PVD process. The layers of a SAF structure 1111 are the same or substantially the same as the layers in the SAF structure 118 described above.

In an embodiment, the deposition process concludes with a blanket deposition of a conductive layer 1113 on an uppermost surface of the layers of a SAF structure 1111. In an embodiment, the conductive layer 1113 includes a material that is suitable to act as a hardmask during a subsequent etching of the MTJ material layer stack 1101 to form a SOT device. In an embodiment, the conductive layer 1113 includes a material such as TiN, Ta or TaN. In an embodiment, the thickness of the top electrode layer ranges from 5 nm-70 nm. The thickness of the conductive layer 1113 is chosen to accommodate patterning of the MTJ material layer stack 1101 to form a MTJ device.

In an embodiment, after all the layers in the MTJ material layer stack 1101 are deposited, an anneal is performed under conditions well known in the art. In an embodiment, the anneal process enables formation of a crystalline MgO-tunnel barrier layer 1107 to be formed. In an embodiment, the anneal is performed immediately post deposition but before patterning of the MTJ material layer stack 1101. A post-deposition anneal of the MTJ material layer stack 1101 is carried out in a furnace at a temperature between 300-350 degrees Celsius in a forming gas environment. In an embodiment, the forming gas includes a mixture of $H_2$ and $N_2$ gas. In an embodiment, the annealing process promotes solid phase epitaxy of the free magnetic layer 1105 to follow a crystalline template of the tunnel barrier layer 1107 (e.g., MgO) that is directly above the free magnetic layer 1105. In an embodiment, the anneal also promotes solid phase epitaxy of the fixed magnetic layer 1109 to follow a crystalline template of the tunnel barrier layer 1107 (e.g., MgO) that is directly below the fixed magnetic layer 1109. <001> Lattice matching between the tunnel barrier layer 1107 and the free magnetic layer 1105 and <001> lattice matching between the tunnel barrier layer 1107 and the fixed magnetic layer 1109 enables a TMR ratio of at least 90% to be obtained in the MTJ material layer stack 1101.

In an embodiment, when the free magnetic layer 1105 includes boron, the annealing process enables boron to diffuse away from an interface 1130 between the free magnetic layer 1105 and the tunnel barrier layer 1107. The process of diffusing boron away from the interface 1130 enables lattice matching between the free magnetic layer 1105 and the tunnel barrier layer 1107. In an embodiment, when the fixed magnetic layer 1109 includes boron, the annealing process enables boron to diffuse away from an interface 1132 between the fixed magnetic layer 1109 and the tunnel barrier layer 1107.

In an embodiment, the annealing process is also performed in the presence of a magnetic field which sets a direction of magnetization of the fixed magnetic layer 1109, the free magnetic layer 1105. In an embodiment, during the annealing process, an applied magnetic field that is directed perpendicular to a plane of MTJ material layer stack 1101 enables a perpendicular anisotropy to be set in the fixed magnetic layer 1109 and in the free magnetic layer 1105. In an embodiment, the annealing process initially aligns the magnetization of the fixed magnetic layer 1109 and magnetization of the free magnetic layer 1105 to be parallel to each other and perpendicular to the plane of the MTJ material layer stack 1101.

While one MTJ material layer stack 1101 has been described in this embodiment, alternative material layer stacks may include multi layers of materials to form a composite free magnet.

The method concludes by forming a mask 1115 over the material layer stack 1101. In some embodiments, the mask 1115 includes a photoresist material. In other embodiments, the mask includes a patterned layer of dielectric material. The mask defines a shape and size of a MTJ device and a location where the MTJ device is to be subsequently formed with respect the layer of SOC material 1103.

FIG. 12A illustrates a cross-sectional view of the structure in FIG. 11 following patterning and etching of the MTJ material layer stack 1101. In an embodiment, the patterning includes a plasma etch process. In an embodiment, the plasma etch process is utilized to pattern the layers of the MTJ material layer stack 1101 and the layer of spin orbit coupling material 1103 to form a block 1201. The block 1201 includes a MTJ material layer stack 1101 and an SOT electrode 102. In some embodiments, depending on the etch parameters, the block 1201 may have sidewalls that are tapered as indicated by the dashed lines 1210. In the illustrative embodiment, a plasma etch process utilized to form the block 1201 possesses sufficient ion energy and chemical reactivity to render vertical etched sidewalls of the block 1201. As shown the etch is stopped before removing portions of the dielectric layer 122. The block 1201 has a height, $H_{MLS}$, which is equivalent to a combined thickness of the material layer stack 1101 and a thickness of the SOT electrode 102

In other embodiments, the patterning process includes an ion milling process. In yet another embodiment, the patterning process includes a combination of a plasma etch and an ion milling process.

FIG. 12B illustrates an isometric view of the structure in FIG. 12A. The block 1201 can be any polyhedron. In the illustrative embodiment, the block 1201 is rectangular. The block 1201 has a length (along the X direction), and a width (along the Y direction), that define a length, LSOT and width, WSOT of the SOT electrode 102 and a height (along the Z direction), $H_{MLS}$. FIG. 12B also illustrates a maximum width an MTJ device can have after it is patterned from the block 1201. In the illustrative embodiment, the maximum width of the MTJ device that will be formed is also given by WSOT.

Figure 13:
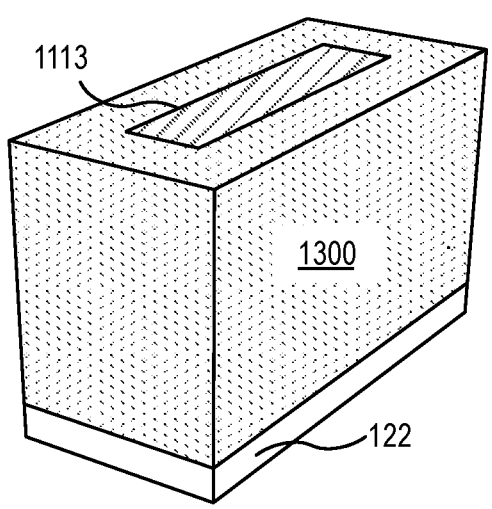
FIG. 13 illustrates an isometric view of the structure in FIG. 12B following the formation of a dielectric layer adjacent to the block.

FIG. 13 illustrates an isometric view of the structure in FIG. 12B following the deposition of a dielectric layer 1300 and a planarization process. In an embodiment, a dielectric layer 1300 is blanket deposited on the block 1201 and on the dielectric layer 122. The dielectric layer 1300 is then planarized. In some examples, an uppermost portion of the conductive layer 1113 is also planarized. In an embodiment, a chemical mechanical polish (CMP) process is utilized to planarize the dielectric layer 1300 and portions of the conductive layer 1113. In some examples, such as is shown, the CMP process leaves uppermost surfaces of the dielectric layer 1300 and the conductive layer 1113 that are coplanar or substantially coplanar.

Figure 14:
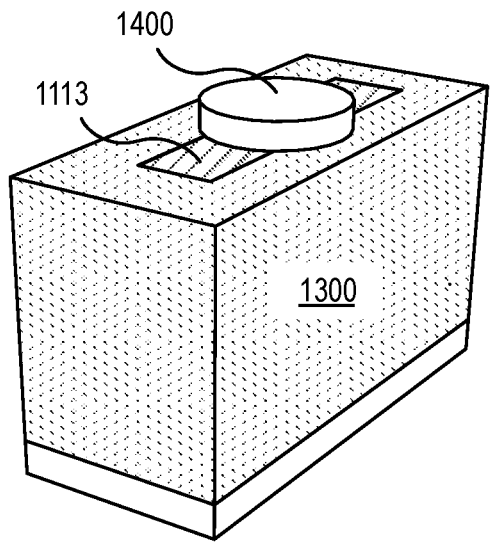
FIG. 14 illustrates an isometric view of the structure in FIG. 13 following the formation of a mask to pattern the block to form a SOT memory device, in accordance with an embodiment of the present disclosure.

FIG. 14 illustrates an isometric view of the structure in FIG. 13 following the formation of a mask 1400. In some embodiments, the mask 1400 includes a photoresist material. In other embodiments, the mask includes a patterned dielectric material. The mask 1400 defines a shape and size of a MTJ device and a location where the MTJ device is to be subsequently formed with respect to the SOT electrode 102. In the illustrative embodiment, the mask has a circular shape and extends over the conductive layer 1113 and over portions of the dielectric layer 1300. The mask may have a shape similar to any of the shapes of the uppermost surfaces of the MTJ devices discussed in association with FIG. 1A, 2A, 3A, 4A, 5, 6 or 7A.

Figure 15:
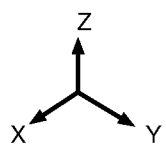
FIG. 15 illustrates an isometric view of the structure in FIG. 14 following the processing of etching unmasked portions of the dielectric layer adjacent to the block and leaving masked portions of the dielectric layer adjacent to the block, in accordance with an embodiment of the present disclosure.
Figure 15:
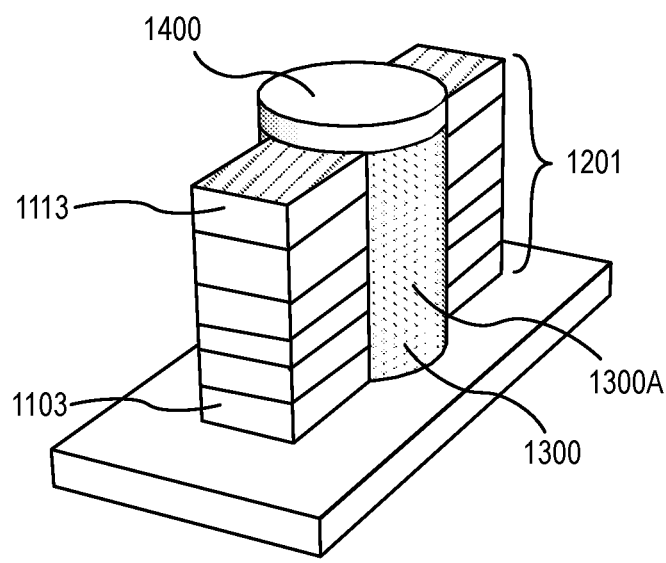

FIG. 15 illustrates an isometric view of the structure in FIG. 14 following the etching of the dielectric layer 1300 from portions surrounding the block 1201 that are not covered by the mask 1400. In the illustrative embodiment, a portion 1300A of the dielectric layer 1300 covered by the mask 1400 adjacent to the block remains after the etch process.

In an embodiment, the dielectric layer 1300 is etched using a plasma etch process that is selective to the conductive layer 1113 and the remaining layers in the block 1201. In one example, as shown the dielectric layer 1300 is etched until the dielectric layer 122 is exposed. In other examples, the dielectric layer 1300 remains adjacent to the SOT electrode 102.

Figure 16A:
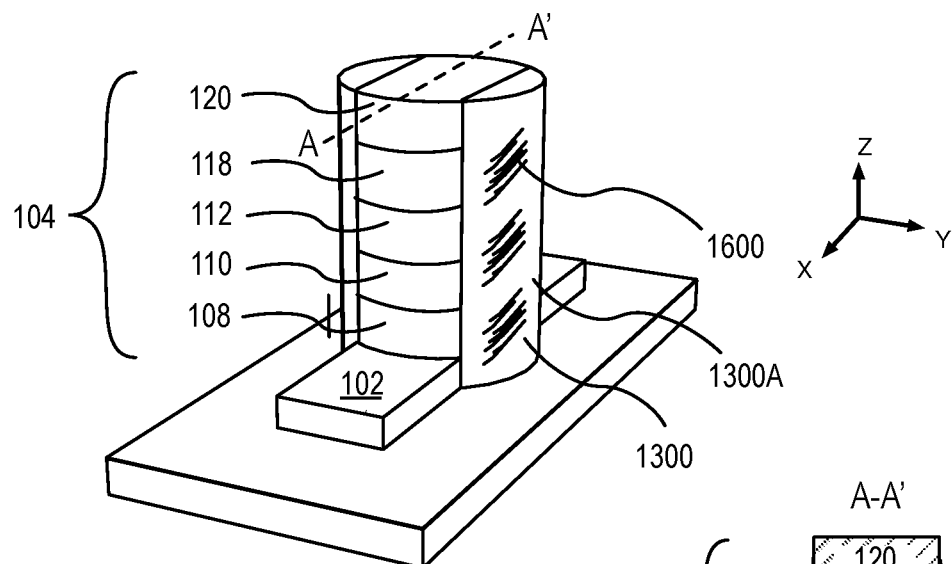
FIG. 16A illustrates an isometric view of the structure in FIG. 15 following the processing of etching the block to form a SOT memory device.
Figure 16B:
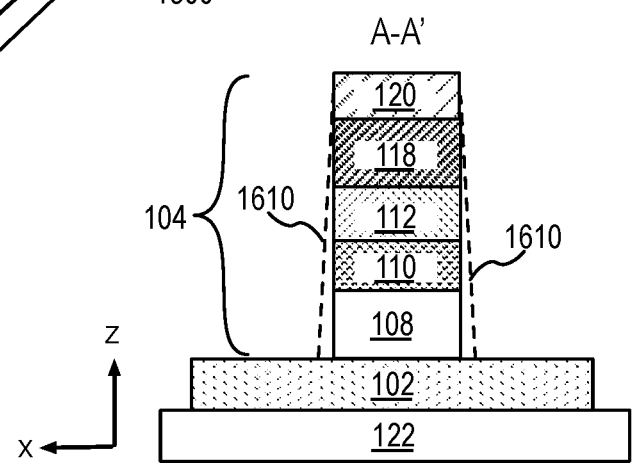
FIG. 16B illustrates a cross-sectional view of the structure in FIG. 16A.

FIG. 16A illustrates an isometric view of the structure in FIG. 15 following the etching of the block 1201 not covered by the mask 1400. In an embodiment, the etch process is substantially similar to the etch process utilized to form the block 1201, with the exception that the SOT electrode 102 in the block 1201 is not etched.

In an embodiment, the patterning process includes etching the conductive layer 1113 by a plasma etch process to form an electrode 120. In an embodiment, the plasma etch process is then continued to pattern the remaining layers of the block 1201 to form a MTJ device 104. In the illustrative embodiment, the plasma etch process is utilized to etch the various layers in the block 1201 to form a SAF structure 118, a fixed magnet 116, a tunnel barrier 114 and a free magnet 108. The plasma etch process also exposes an uppermost surface of the SOT electrode 102.

In an embodiment, plasma etch process possesses sufficient ion energy and chemical reactivity to render vertical etched sidewalls of the MTJ device 104 as shown. In some embodiments, depending on the etch parameters, the MTJ device 104 may have sidewalls that are tapered as indicated by the dashed lines 1625 in the cross-sectional illustration of FIG. 16B.

Referring to FIG. 16A, in some embodiments, etch residue 1600 may be formed on sidewalls of the etched MTJ device 104 and on sidewalls of the dielectric layer portion 1300A. A residue clean-up process may be implemented to substantially remove the etch residue 1600 from the sidewalls of the MTJ device 104. In some examples, some amount of etch residue may remain on sidewalls of the dielectric layer portion 1300A as shown.

Figure 17:
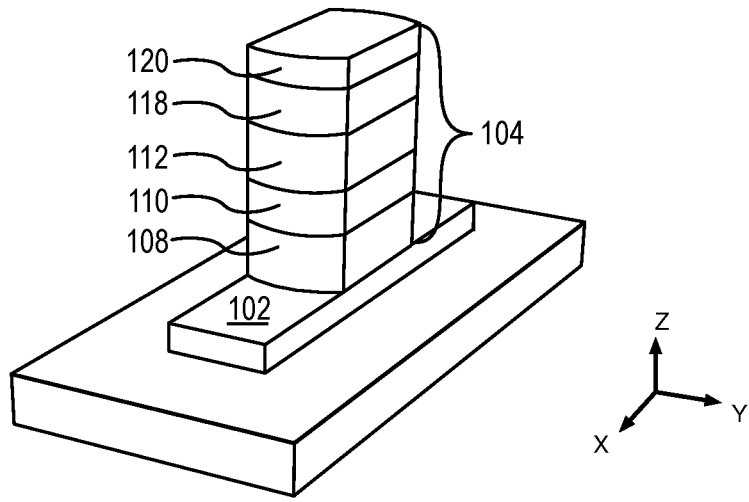
FIG. 17 illustrates an isometric view of the structure in FIG. 16A following the processing of removing masked portions of the dielectric layer adjacent to the block, in accordance with an embodiment of the present disclosure.

FIG. 17 illustrates an isometric view of the structure in FIG. 16A following the removal of the dielectric layer 1300, selectively to the dielectric layer 122. In other embodiments, not shown, the dielectric layer 1300 is not removed. In another example, a dielectric spacer may be formed on the structure of FIG. 16A.

While the method is described above to form a SOT memory device 100 in FIG. 4A, the SOT memory devices described in FIGS. 1A, 2A, 3A, 5, 6 and 7A are also fabricated in a similar manner. The size of the mask and position of the mask relative to the block 1201 determines the structures described in FIGS. 1A, 2A, 3A, 5, 6 and 7A.

Figure 18:
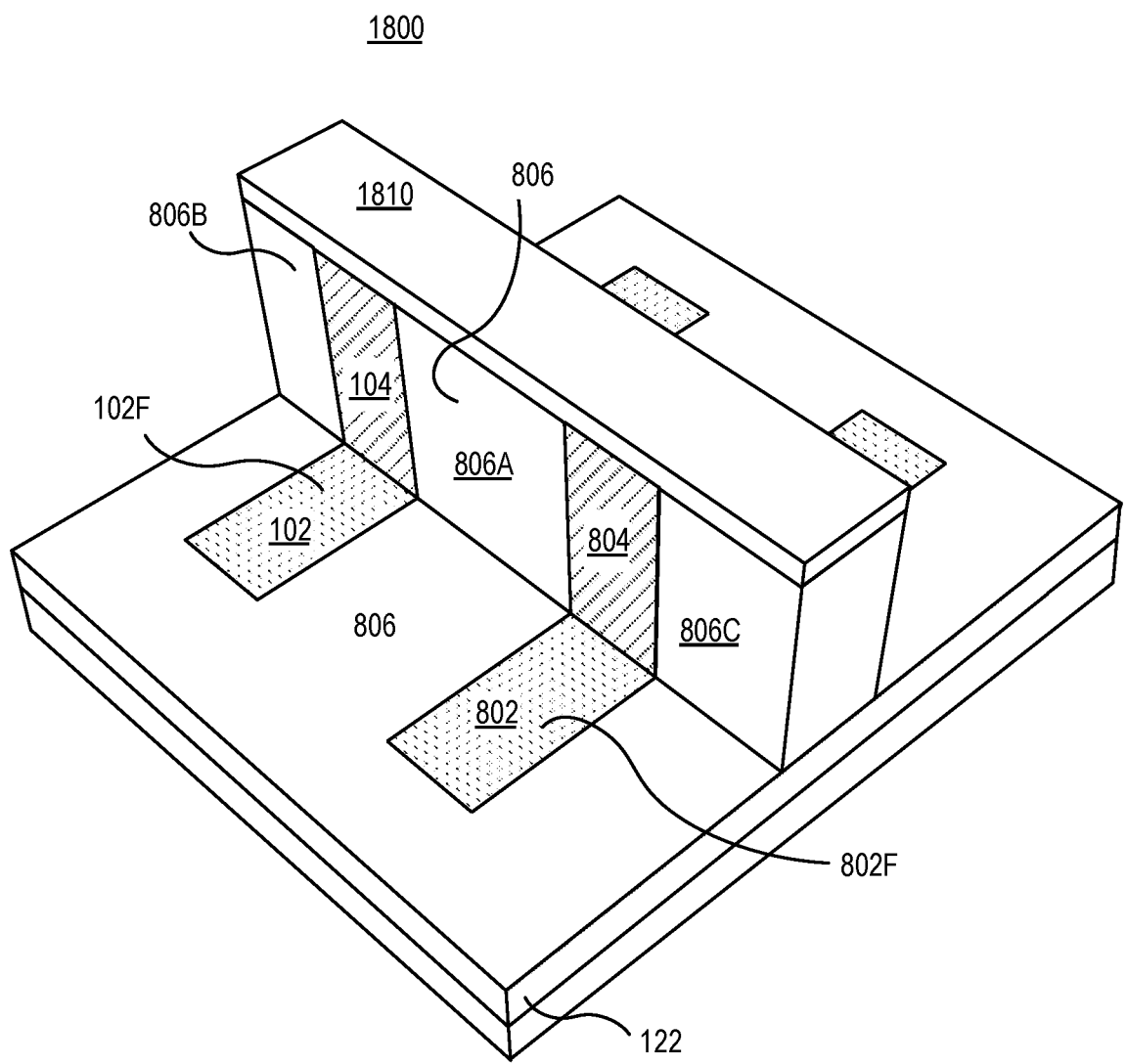
FIG. 18 illustrates an isometric view of a first and a second MT device formed above a first and a second SOT electrode, respectively, in an array structure.

FIG. 18 illustrates an isometric view of an array structure 1800 after the formation of a first MTJ device 104 and a second MTJ device 804 above a first SOT electrode 102 and a second SOT electrode 802. In the illustrative embodiment, a mask 1810 extends from above a first patterned MTJ device 104, over the dielectric material portion 806A and onto a second patterned MTJ device 804. The mask 1810 also extends over dielectric material portions 806B and 806C. Prior to patterning the MTJ devices 104, 804, dielectric material 806 is patterned in areas exposed by the mask 1810. In the illustrative embodiment, the dielectric material 806 adjacent to the SOT electrodes 102 and 802 is not removed during the patterning of the dielectric material 806.

In one example, a single mask is utilized to simultaneously pattern both MTJ devices 104 and 804 after patterning the dielectric material 806. In some such embodiments, the uppermost surfaces 102F and 802F of the SOT electrodes 102 and 802, respectively, are exposed after formation of the MTJ devices 104 and 804. In some examples, portions of the dielectric material 806 adjacent to the SOT electrodes 102 and 802 may be recessed below the uppermost surfaces 102F and 802F during patterning of the dielectric material 806.

Figure 19:
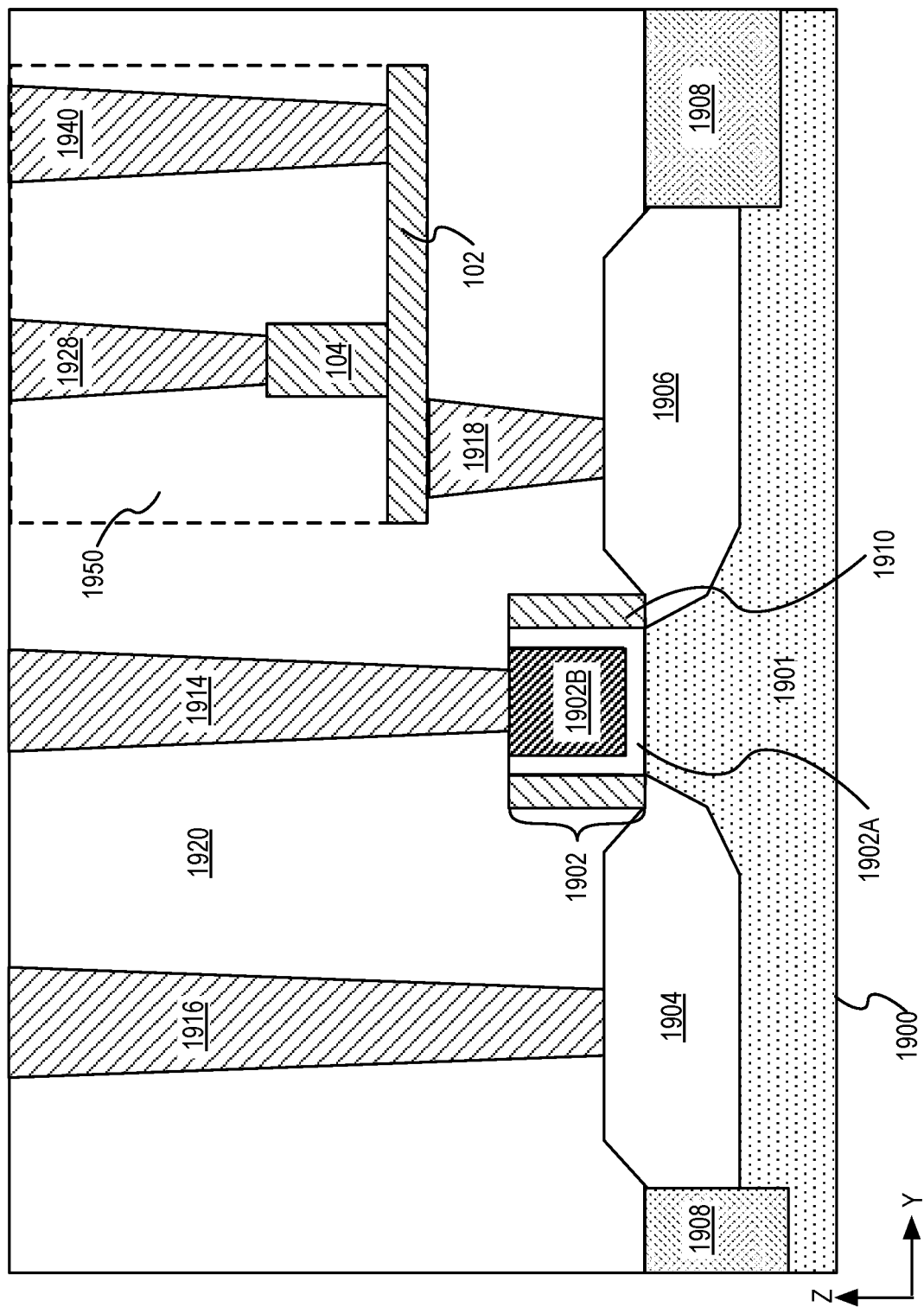
FIG. 19 illustrates a cross-sectional view of a SOT memory device having one terminal coupled to a drain of a transistor, a second terminal coupled to a second electrode and a third terminal coupled to the MTJ device.

FIG. 19 illustrates a SOT device coupled to an access transistor 1000. In an embodiment, the SOT memory device 1950 includes a MTJ device 104 on a SOT electrode 102. The SOT memory device 1950 may be any of the SOT memory devices described in association with FIGS. 1A, 2A, 3A, 4A, 5, 6 and 7A.

In an embodiment, the transistor 1900 has a source region 1904, a drain region 1906 and a gate 1902. The transistor 1900 further includes a gate contact 1914 above and electrically coupled to the gate 1902, a source contact 1916 above and electrically coupled to the source region 1904, and a drain contact 1918 above and electrically coupled to the drain region 1906 as is illustrated in FIG. 19. In the illustrative embodiment, the MTJ device 104 includes one or more features of the MTJ device 104 described in association with FIG. 1E.

In the illustrative embodiment, one portion of electrode 102 is in electrical contact with the drain contact 1918 of transistor 1900. A MTJ contact 1928 is on and electrically coupled with the MTJ device 104. An interconnect metallization structure 1940 is on and electrically coupled with the electrode 102. In the illustrative embodiment, the MTJ device 104 is laterally between the drain contact 1918 and interconnect metallization structure 1940. In some embodiments, the MTJ device 104 is laterally closer to the drain contact 1918 than to interconnect metallization structure 1940. In other embodiments, the MTJ device 104 is laterally closer to the interconnect metallization structure 1940 than to the drain contact 1918. In some embodiments, the MTJ device 104 is approximately mid-way, laterally, between the interconnect metallization structure 1940 and the drain contact 1918.

In an embodiment, the underlying substrate 1901 represents a surface used to manufacture integrated circuits. Suitable substrate 1901 includes a material such as single crystal silicon, polycrystalline silicon and silicon on insulator (SOI), as well as substrates formed of other semiconductor materials. In some embodiments, the substrate 1901 is the same as or substantially the same as the substrate 150. The substrate 1901 may also include semiconductor materials, metals, dielectrics, dopants, and other materials commonly found in semiconductor substrates.

In an embodiment, the transistor 1900 associated with substrate 1901 are metal-oxide-semiconductor field-effect transistors (MOSFET or simply MOS transistors), fabricated on the substrate 1901. In various implementations of the invention, the access transistor 1900 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In some embodiments, gate 1902 includes at least two layers, a gate dielectric layer 1902A and a gate electrode 1902B. The gate dielectric layer 1902A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1902A to improve its quality when a high-k material is used.

The gate electrode 1902B of the access transistor 1900 of substrate 1901 is formed on the gate dielectric layer 1902A and may consist of at least one P-type work function metal or N-type work function metal, depending on whether the transistor is to be a PMOS or an NMOS transistor. In some implementations, the gate electrode 1902B may consist of a stack of two or more metal layers, where one or more metal layers are work function metal layers and at least one metal layer is a conductive fill layer.

For a PMOS transistor, metals that may be used for the gate electrode 1902B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1902B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 1902B may consist of one or more U-shaped metal layers formed atop one or more planar, non-U-shaped layers.

In some implementations of the invention, a pair of sidewall spacers 1910 are on opposing sides of the gate 1902 that bracket the gate stack. The sidewall spacers 1910 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 1904 and drain region 1906 are formed within the substrate adjacent to the gate stack of each MOS transistor. The source region 1904 and drain region 1906 are generally formed using either an implantation/diffusion process or an etching/deposition process. In the former process, dopants such as boron, aluminum, antimony, phosphorous, or arsenic may be ion-implanted into the substrate to form the source region 1904 and drain region 1906. An annealing process that activates the dopants and causes them to diffuse further into the substrate typically follows the ion implantation process. In the latter process, the substrate 1901 may first be etched to form recesses at the locations of the source and drain regions. An epitaxial deposition process may then be carried out to fill the recesses with material that is used to fabricate the source region 1904 and drain region 1906. In some implementations, the source region 1904 and drain region 1906 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1904 and drain region 1906 may be formed using one or more alternate semiconductor materials such as germanium or a group III-V material or alloy. And in further embodiments, one or more layers of metal and/or metal alloys may be used to form the source region 1904 and drain region 1906. In the illustrative embodiment, an isolation 1908 is adjacent to the source region 1904, drain region 1906 and portions of the substrate 1901.

In an embodiment, a source contact 1914, drain contact 1916 and gate contact 1914 are adjacent to dielectric layer 1920.

In an embodiment, the source contact 1916, the drain contact 1914 and gate contact 1918 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The dielectric layer 1920 may include any material that has sufficient dielectric strength to provide electrical isolation such as, but not, limited silicon dioxide, silicon nitride, silicon oxynitride, carbon doped nitride and carbon doped oxide. An isolation 1908 adjacent to source region 1904 and drain region 1906 may include any material that has sufficient dielectric strength to provide electrical isolation such as, but not, limited silicon dioxide, silicon nitride, silicon oxynitride, carbon doped nitride and carbon doped oxide.

Figure 20:
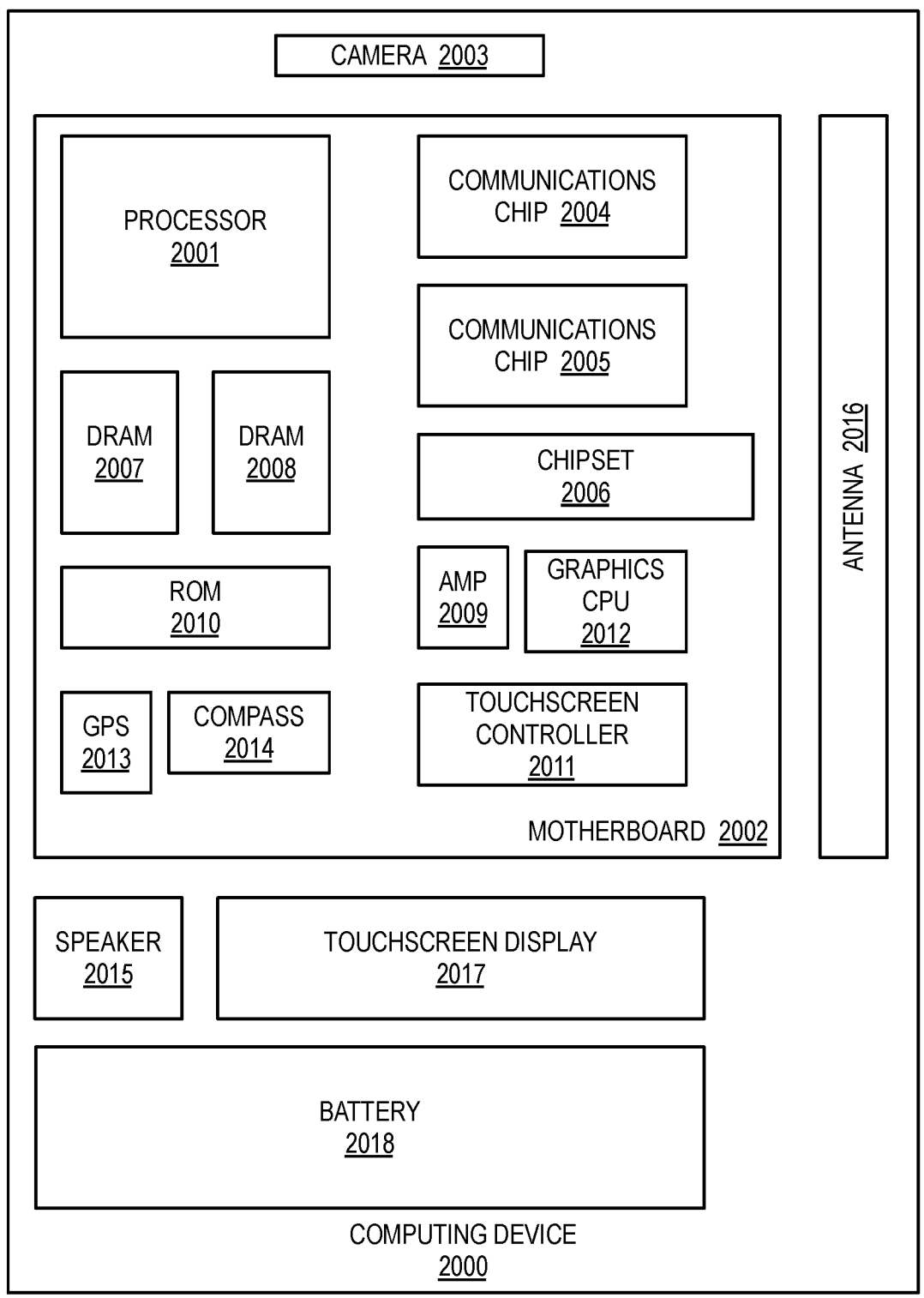
FIG. 20 illustrates a computing device in accordance with embodiments of the present disclosure.

FIG. 20 illustrates a computing device 2000 in accordance with embodiments of the present disclosure. As shown, computing device 2000 houses a motherboard 2002. Motherboard 2002 may include a number of components, including but not limited to a processor 2001 and at least one communications chip 2004 or 2005. Processor 2001 is physically and electrically coupled to the motherboard 2002. In some implementations, communications chip 2005 is also physically and electrically coupled to motherboard 2002. In further implementations, communications chip 2005 is part of processor 2001.

Depending on its applications, computing device 2000 may include other components that may or may not be physically and electrically coupled to motherboard 2002. These other components include, but are not limited to, volatile memory (e.g., DRAM), non-volatile memory (e.g., ROM), flash memory, a graphics processor, a digital signal processor, a crypto processor, a chipset 2006, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 2005 enables wireless communications for the transfer of data to and from computing device 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 2005 may implement any of a number of wireless standards or protocols, including but not limited to Wi-Fi (IEEE 802.6 family), WiMAX (IEEE 802.8 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 2000 may include a plurality of communications chips 2004 and 2005. For instance, a first communications chip 2005 may be dedicated to shorter range wireless communications such as Wi-Fi and Bluetooth and a second communications chip 2004 may be dedicated to longer range wireless communications such as GPS, EDGE, GPRS, CDMA, WiMAX, LTE, Ev-DO, and others.

Processor 2001 of the computing device 2000 includes an integrated circuit die packaged within processor 2001. In some embodiments, the integrated circuit die of processor 2001 includes one or more memory devices, such as a SOT memory device 100, 200, 300, 400, 500, 600, 700, including a MTJ device 104 in accordance with embodiments of the present disclosure. The term "processor" may refer to any device or portion of a device that processes electronic data from registers and/or memory to transform that electronic data into other electronic data that may be stored in registers and/or memory.

Communications chip 2005 also includes an integrated circuit die packaged within communication chip 2005. In another embodiment, the integrated circuit die of communications chips 2004, 2005 include a memory array with memory cells including at least one SOT memory device such as a SOT memory device 100 including a MTJ device 104 on a SOT electrode 102. Depending on its applications, computing device 2000 may include other components that may or may not be physically and electrically coupled to motherboard 2002. These other components may include, but are not limited to, volatile memory (e.g., DRAM) 2007, 2008, non-volatile memory (e.g., ROM) 2010, a graphics CPU 2012, flash memory, global positioning system (GPS) device 2013, compass 2014, a chipset 2006, an antenna 2016, a power amplifier 2009, a touchscreen controller 2011, a touchscreen display 2017, a speaker 2015, a camera 2003, and a battery 2018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 2000 and discussed above may contain a stand-alone integrated circuit memory die that includes one or more arrays of memory cells including one or more memory devices, such as a SOT memory device 100,200,300,400,500,600, or 700, including a MTJ device 104 on a SOT electrode 102, described in accordance with embodiments of the present disclosure In various implementations, the computing device 2000 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 2000 may be any other electronic device that processes data.

Figure 21:
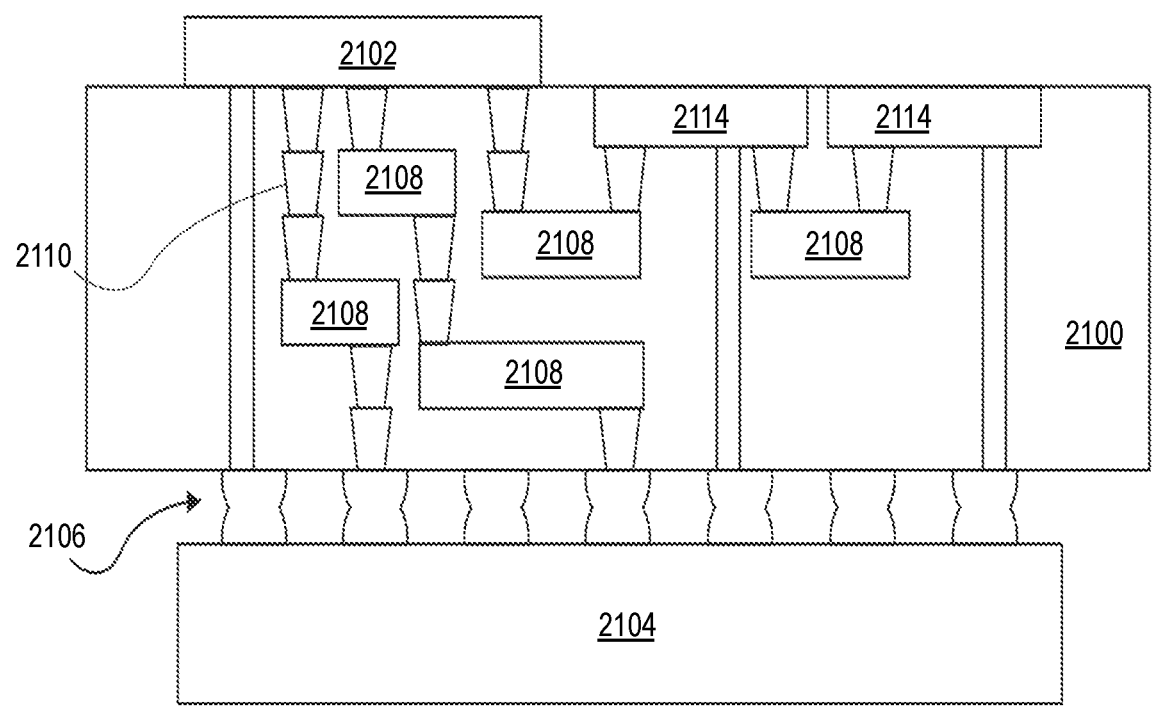
FIG. 21 illustrates an integrated circuit (IC) structure that includes one or more embodiments of the present disclosure.

FIG. 21 illustrates an integrated circuit (IC) structure 2100 that includes one or more embodiments of the disclosure. The integrated circuit (IC) structure 2100 is an intervening substrate used to bridge a first substrate 2102 to a second substrate 2104. The first substrate 2102 may be, for instance, an integrated circuit die. The second substrate 2104 may be, for instance, a memory module, a computer mother, or another integrated circuit die. Generally, the purpose of an integrated circuit (IC) structure 2100 is to spread a connection to a wider pitch or to reroute a connection to a different connection. For example, an integrated circuit (IC) structure 2100 may couple an integrated circuit die to a ball grid array (BGA) 2106 that can subsequently be coupled to the second substrate 2104. In some embodiments, the first and second substrates 2102/2104 are attached to opposing sides of the integrated circuit (IC) structure 2100. In other embodiments, the first and second substrates 2102/2104 are attached to the same side of the integrated circuit (IC) structure 2100. And in further embodiments, three or more substrates are interconnected by way of the integrated circuit (IC) structure 2100.

The integrated circuit (IC) structure 2100 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials. The integrated circuit (IC) structure may include metal interconnects 2108 and vias 2110, including but not limited to through-silicon vias (TSVs) 2110. The integrated circuit (IC) structure 2100 may further include embedded devices 2114, including both passive and active devices. Such devices include, but are not limited to, capacitors, decoupling capacitors, resistors, inductors, fuses, diodes, transformers, device structure including transistors, such as transistor 1900 coupled with at least one MTJ memory device such as a MTJ device 104 on a SOT electrode 102 (such as described above in association with FIGS. 1A, 2A, 3A, 4A, 5, 6 and 7A) for example. The integrated circuit (IC) structure 2100 may further include embedded devices 2114 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 2100. In accordance with embodiments of the present disclosure, apparatuses or processes disclosed herein may be used in the fabrication of integrated circuit (IC) structure 2100.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit torque memory device such as the SOT memory device 400 or a memory array structure 800. The spin orbit torque memory device 400 and memory array structure 800 may be used in an embedded non-volatile memory application.

Thus, embodiments of the present disclosure include spin orbit torque memory devices and methods to form the same.

Specific embodiments are described herein with respect to perpendicular spin orbit torque devices. It is to be appreciated that embodiments described herein may also be applicable to other non-volatile memory devices. Such non-volatile memory devices may include, but are not limited to, magnetic random-access memory (MRAM) devices, spin torque transfer memory (STTM) devices such as in-plane STTM or perpendicular STTM devices.

What is claimed is:

1. A memory array structure, comprising:
a first SOT electrode and a second SOT electrode, wherein the first and second SOT electrodes each have a length in a first direction and a width in a second direction, orthogonal to the first direction, and wherein the first and second SOT electrodes are separated from each other by an intervening space along the second direction;
a first MTJ structure over a first portion of the length of the first SOT electrode;
a second MTJ structure over a first portion of the length of the second SOT electrode, wherein the first portions of the lengths of the first and second SOT electrodes are substantially equal;
a first dielectric material layer adjacent to a first sidewall portion of the first MTJ structure and adjacent to a first sidewall portion of the second MTJ structure, wherein the first dielectric material layer occupies the space and has a width substantially equal to the first portions of the lengths; and
a second dielectric material layer adjacent to a second sidewall portion of both the first and second MTJ structures, wherein the second dielectric material layer is over a second portion of the length of the first SOT electrode, and over a second portion of the length of the second SOT electrode, and wherein the second dielectric material layer is adjacent to a sidewall of the first dielectric material layer.

2. The memory array structure of claim 1, wherein the first portion of the lengths comprises a center portion of the SOT electrodes, and wherein the second portion of the lengths of the SOT electrode comprises an end portion of the SOT electrodes.

3. The memory array structure of claim 1, wherein the first dielectric material layer is adjacent to a sidewall of the first portion of the lengths of the first and second SOT electrodes.

4. The memory array structure of claim 3, wherein:
the first dielectric material layer is adjacent to a sidewall of the second portion of the length of the first SOT electrode; and
the first dielectric material layer is adjacent to a sidewall of the second portion of the length of the second SOT electrode.

5. The memory array structure of claim 4, wherein the second dielectric material layer is over the first dielectric material layer that is adjacent to a sidewall of the second portion of the lengths of the first and second SOT electrodes.

6. The memory array structure of claim 1, wherein the first dielectric material layer and the second dielectric material layer have substantially the same material composition.

7. The memory array structure of claim 1, wherein the first dielectric material layer and the second dielectric material layer have different material compositions.

8. The memory array structure of claim 1, wherein each of the first MTJ structure and the second MTJ structure has a first pair parallel sidewalls adjacent to the first dielectric material layer, and wherein the first and second MTJ structures have a second pair of parallel sidewalls adjacent to the second dielectric material layer.

9. The memory array structure of claim 8, wherein the first pair of parallel sidewalls are substantially orthogonal to the second pair of parallel sidewalls.

* * * * *